United States Patent
Lee et al.

(10) Patent No.: US 9,654,109 B2
(45) Date of Patent: May 16, 2017

(54) HARDENED PROGRAMMABLE DEVICES

(71) Applicant: Altera Corporation, San Jose, CA (US)

(72) Inventors: Andy L. Lee, San Jose, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 138 days.

(21) Appl. No.: 14/247,030

(22) Filed: Apr. 7, 2014

(65) Prior Publication Data

US 2014/0218068 A1    Aug. 7, 2014

Related U.S. Application Data

(60) Division of application No. 13/338,701, filed on Dec. 28, 2011, now Pat. No. 8,716,809, which is a
(Continued)

(51) Int. Cl.
*G06F 17/00* (2006.01)
*H03K 19/173* (2006.01)
(Continued)

(52) U.S. Cl.
CPC ........... *H03K 19/173* (2013.01); *G11C 5/005* (2013.01); *H01L 27/0207* (2013.01); *H03K 19/1736* (2013.01); *H03K 19/17784* (2013.01)

(58) Field of Classification Search
USPC ....................................................... 716/101
See application file for complete search history.

(56) References Cited

U.S. PATENT DOCUMENTS 5,840,627 A    11/1998    Huggins
5,885,749 A     3/1999    Huggins et al.
(Continued)

FOREIGN PATENT DOCUMENTS

CN    1716781    1/2006
CN    1855488    11/2006

OTHER PUBLICATIONS

Ang, U.S. Appl. No. 12/356,495, filed Jan. 20, 2009.
Perry, U.S. Appl. No. 12/181,311, filed Jul. 28, 2008.
Rahim et al., U.S. Appl. No. 12/478,713, filed Jun. 4, 2009.

*Primary Examiner* — Mohammed Alam
(74) *Attorney, Agent, or Firm* — Treyz Law Group, P.C.; Andrew C. Milhollin

(57) ABSTRACT

Hardened programmable logic devices are provided with programmable circuitry. The programmable circuitry may be hardwired to implement a custom logic circuit. Generic fabrication masks may be used to form the programmable circuitry and may be used in manufacturing a product family of hardened programmable logic devices, each of which may implement a different custom logic circuit. Custom fabrication masks may be used to hardwire the programmable circuitry to implement a specific custom logic circuit. The programmable circuitry may be hardwired in such a way that signal timing characteristics of a hardened programmable logic device that implements a custom logic circuit may match the signal timing characteristics of a programmable logic device that implements the same custom logic circuit using configuration data.

10 Claims, 20 Drawing Sheets

Related U.S. Application Data continuation of application No. 12/852,422, filed on Aug. 6, 2010, now Pat. No. 8,105,885.

(51) Int. Cl.
*G11C 5/00* (2006.01)
*H01L 27/02* (2006.01)
*H03K 19/177* (2006.01)

(56) References Cited

U.S. PATENT DOCUMENTS

| | | |
|---|---|---|
| 5,953,577 A | 9/1999 | Huggins |
| 5,985,518 A | 11/1999 | Huggins et al. |
| 6,060,330 A | 5/2000 | Huggins et al. |
| 6,080,533 A | 6/2000 | Huggins |
| 6,178,541 B1 | 1/2001 | Joly et al. |
| 6,228,564 B1 | 5/2001 | Huggins |
| 6,346,748 B1 | 2/2002 | Huggins |
| 6,504,398 B1 | 1/2003 | Lien et al. |
| 6,864,712 B2 | 3/2005 | Agarwal et al. |
| 6,992,503 B2 | 1/2006 | Madurawe |
| 7,030,646 B1 | 4/2006 | Tyson |
| 7,030,651 B2 | 4/2006 | Madurawe |
| 7,064,580 B2 | 6/2006 | Lawson et al. |
| 7,210,115 B1 | 4/2007 | Rahim et al. |
| 7,243,315 B2 | 7/2007 | Tan et al. |
| 7,328,420 B1 | 2/2008 | Datta et al. |
| 7,358,766 B2 | 4/2008 | Lawson et al. |
| 7,373,621 B1 | 5/2008 | Dastidar |
| 7,378,874 B2 | 5/2008 | Bharath et al. |
| 7,425,391 B2 | 9/2008 | Zhang |
| 7,555,741 B1 * | 6/2009 | Milton ................ G06F 17/5054 716/101 |
| 7,590,211 B1 | 9/2009 | Burney |
| 7,675,317 B2 | 3/2010 | Perisetty |
| 7,759,705 B2 | 7/2010 | Madurawe |
| 7,944,727 B2 | 5/2011 | Kurjanowicz |
| 8,201,112 B2 * | 6/2012 | Boerstler ........... H03H 11/1217 716/100 |
| 2002/0045136 A1 | 4/2002 | Fritze et al. |
| 2003/0023941 A1 * | 1/2003 | Wang ............... G01R 31/31704 716/103 |
| 2004/0196065 A1 * | 10/2004 | Madurawe ......... G06F 17/5045 326/41 |
| 2004/0222817 A1 * | 11/2004 | Madurawe ........... H01L 27/105 326/39 |
| 2005/0121789 A1 * | 6/2005 | Madurawe ......... H01L 27/0207 257/758 |
| 2006/0139056 A1 | 6/2006 | Madurawe |
| 2006/0279330 A1 | 12/2006 | Phoon et al. |
| 2007/0210336 A1 | 9/2007 | Madurawe |
| 2008/0054939 A1 | 3/2008 | Bharath et al. |
| 2008/0132007 A1 | 6/2008 | Winegarden et al. |
| 2009/0051387 A1 * | 2/2009 | Hutton ............ H03K 19/17732 326/41 |
| 2009/0262566 A1 | 10/2009 | Kurjanowicz |
| 2010/0025861 A1 | 2/2010 | Zhang |
| 2013/0058147 A1 | 3/2013 | Zhang |

\* cited by examiner

HARDENED PROGRAMMABLE DEVICES

This application is a division of patent application Ser. No. 13/338,701, filed Dec. 28, 2011, which is a continuation of patent application Ser. No. 12/852,422, filed Aug. 6, 2010, each of which is hereby incorporated by reference herein in its entirety. This application claims the benefit of and claims priority to patent application Ser. No. 13/338,701, filed Dec. 28, 2011 and patent application Ser. No. 12/852,422, filed Aug. 6, 2010.

BACKGROUND

This relates to integrated circuits such as integrated circuits with mask-programmed layers.

Programmable logic devices are well known. Programmable logic devices can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable logic device memory elements to configure the devices to perform the functions of the custom logic circuit. In particular, the configuration data configures programmable interconnects, programmable routing circuits, and programmable logic circuits in the programmable logic devices.

Structured application-specific integrated circuits (sometimes referred to as structured ASICs or mask-programmed integrated circuits) are another well known type of integrated circuit. Structured ASICs can exhibit reduced unit cost and power consumption compared to electrically programmable integrated circuit. Unlike electrically-programmable logic devices, once a structured ASIC is manufactured, the structured ASIC is locked into a particular custom logic design and cannot be reconfigured to implement another custom logic design. Structured ASICs are manufactured using standard logic layers and custom routing and interconnect mask layers. The standard logic layers are common to all potential custom logic designs that the structured ASICs are capable of implementing. However, unique custom routing and interconnect layers are required for each custom logic design.

Because of the differences between programmable logic devices and structured ASICs, a given user design may not have the same operating characteristics when implemented using structured ASICs as that design has when implemented using programmable logic devices. It would therefore be desirable to provide devices that can implement a given user design with operating characteristics that are similar to, or exactly the same as, when that user design is implemented in a programmable logic device.

SUMMARY

Programmable devices may include programmable circuitry that is hardwired to implement a custom logic circuit. Devices that include electrically-programmable circuitry that has been hardwired into a particular configuration (e.g., for a particular custom logic circuit) may be referred to herein as hardened devices, hardened programmable devices, and hardened programmable logic devices. As examples, the devices may include configuration memory elements with outputs that are hardwired to power supply lines to supply the appropriate output as needed in the custom logic circuit, programmable pass transistors with gate terminals that are hardwired to power supply lines to turn on or turn off the transistors as needed in the custom logic circuit, multiplexers with control inputs that are hardwired to permanently route a particular input to an output node or that include bypass paths that connect that input to the input node as needed in the custom logic circuit, input-output circuitry that is hardwired to a particular one of two different input-output circuit blocks as needed in the custom logic circuit, level shifter circuitry that is selectively turned on or turned off and bypassed as needed in the custom logic circuit.

Custom and generic photolithographic fabrication masks may be used in the manufacture of the hardened programmable logic devices in a product family of hardened programmable logic devices. The generic fabrication masks may also be used in the manufacture of programmable logic devices in a product family of programmable logic devices. The generic fabrication masks may, as an example, be used in forming programmable circuitry. The custom fabrication masks may, as an example, be used in hardwiring the programmable circuitry to implement a particular custom logic design.

Further features of the invention, its nature and various advantages will be more apparent from the accompanying drawings and the following detailed description of the preferred embodiments.

DETAILED DESCRIPTION

The present invention relates to hardened programmable logic devices, which may be referred to herein as hardened programmable logic device integrated circuits. The hardened programmable logic devices may include programmable logic, programmable interconnects, and programmable routing circuitry that is hardwired to a given custom logic design.

Figure 1:
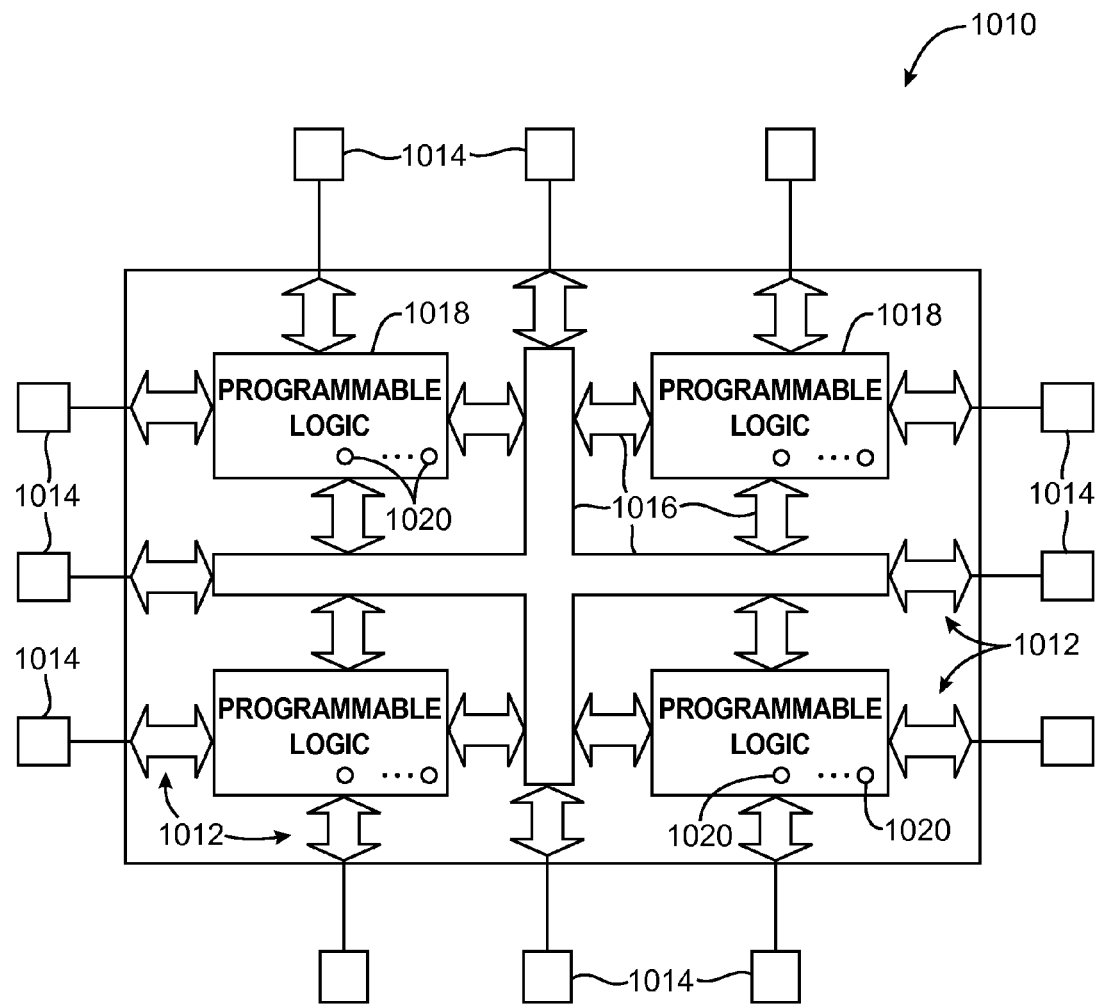
FIG. 1 is a diagram of a conventional programmable logic device.

A conventional programmable integrated circuit is shown in FIG. 1. Device 1010 includes input-output circuitry 1012 for driving signals off of device 1010 and for receiving signals from other devices via input-output pins 1014. Interconnection resources 1016 such as global and local vertical and horizontal conductive lines and buses are used to route signals on device 1010. Interconnection resources 1016 include fixed interconnects (conductive lines) and programmable interconnects (i.e., programmable connections between respective fixed interconnects). Programmable logic 1018 includes combinational and sequential logic circuitry. The programmable logic 1018 is configured by configuration data to perform a custom logic function. The programmable interconnects associated with interconnection resources 1016 may be considered to be a part of programmable logic 1018.

Device 1010 contains programmable memory elements 1020. Memory elements 1020 are loaded with configuration data using pins 1014 and input-output circuitry 1012. Once loaded, the memory elements each provide a corresponding static control output signal that controls the state of an associated logic component in programmable logic 1018. The memory element output signals are typically applied to the gates of metal-oxide-semiconductor (MOS) transistors. These transistors include n-channel metal-oxide-semiconductor (NMOS) pass transistors in programmable components such as multiplexers and logic array blocks (LABS).

Figure 2:
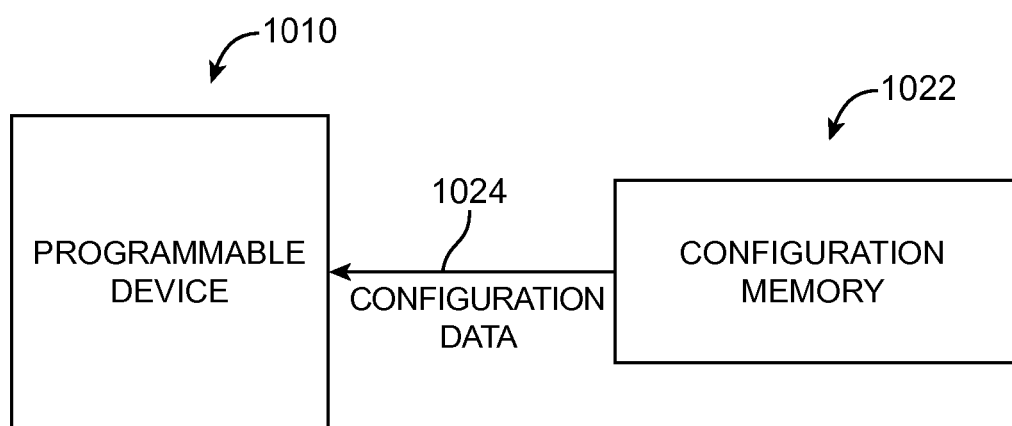
FIG. 2 is a diagram of a conventional programmable logic device and external configuration memory that provides configuration data to the programmable logic device during a configuration phase.

A system environment for a conventional programmable integrated circuit is shown in FIG. 2. As shown in FIG. 2, device 1010 receives configuration data from configuration memory 1022. When device 1010 boots up, the configuration data for configuring integrated circuit 1010 is supplied to integrated circuit 1010 from device 1022, as shown schematically by path 1024. The configuration data that is supplied to integrated circuit 1010 is stored in circuit 1010 in its programmable memory elements 1020. Because circuit 1010 requires an external circuit 1022 to provide the configuration data, the cost and complexity of systems utilizing programmable integrated circuits is increased.

Figure 3:
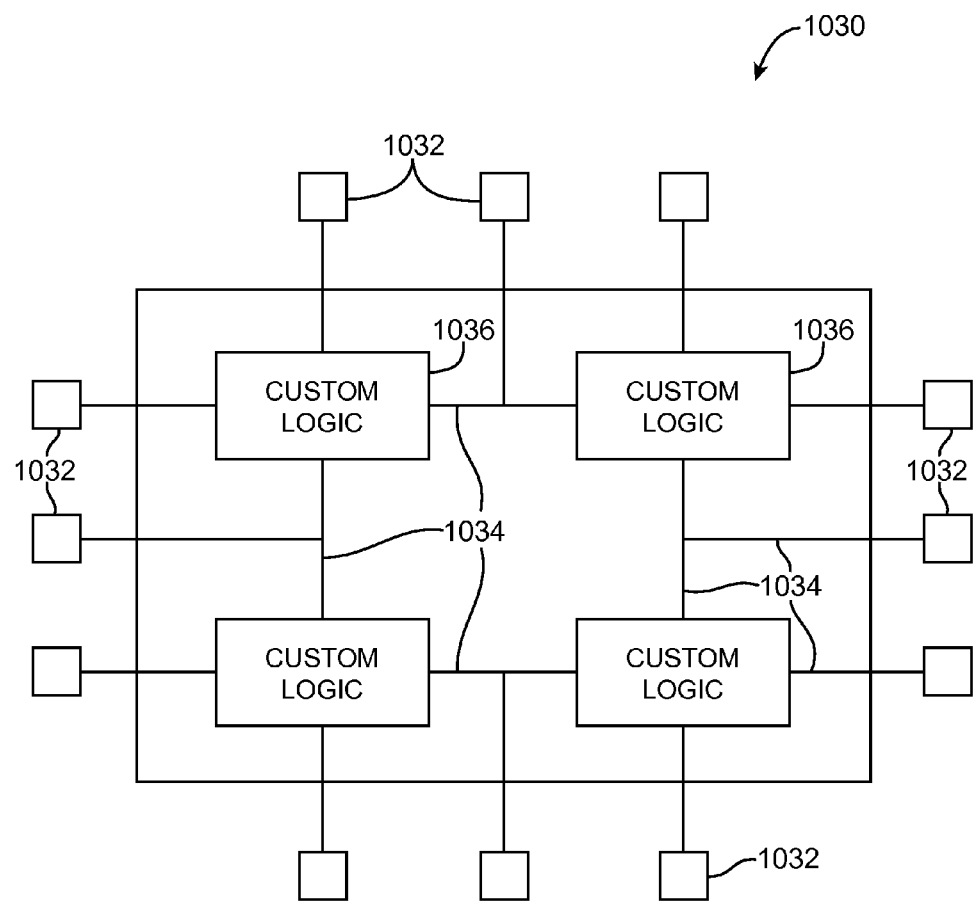
FIG. 3 is a diagram of a conventional structured application-specific integrated circuit device.

A conventional structured application-specific integrated circuit (ASIC) device is shown in FIG. 3. Structured ASIC device 1030 includes input-output circuitry for driving signals off device 1030 and for receiving signals from other devices via input-output pins 1032. Custom interconnection resources 1034 route signals on device 1010. Custom logic 1036 includes combinational and sequential logic circuitry. The custom logic 1036 is customized by custom mask sets to perform a custom logic function within a particular user design.

Unlike the interconnection resources 1016 and the programmable logic 1018 of programmable logic device 1010 of FIG. 1, interconnection resources 1034 and custom logic 1036 of structured ASIC device 1030 are not programmable and are customized based on custom logic circuit designs. Once a structured ASIC device 1030 has been manufactured for a particular user design it cannot be used to implement a different user design, unlike the programmable logic devices 1010 which may be reconfigured to implement a variety of different user designs.

Figure 4:
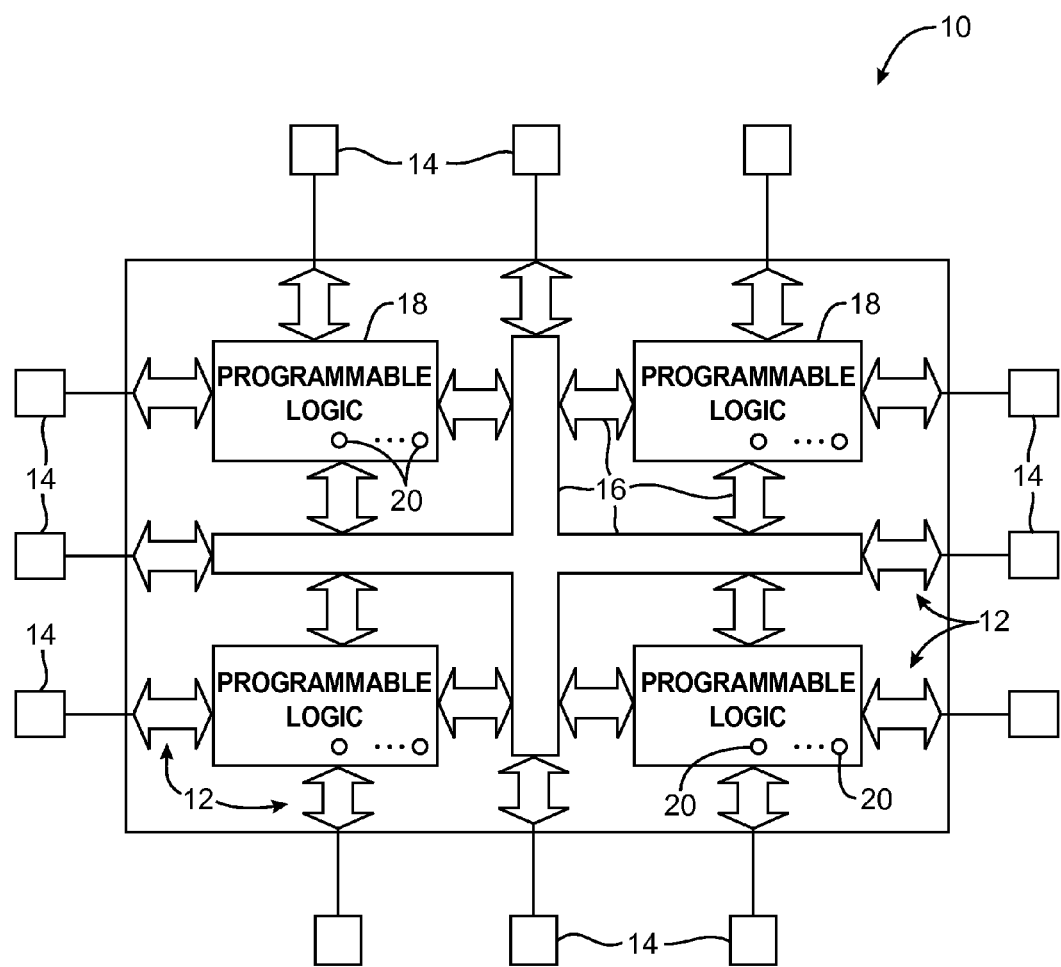
FIG. 4 is a diagram of an illustrative hardened integrated circuit such as a hardened programmable logic device in accordance with an embodiment of the present invention.

An illustrative hardened programmable integrated circuit such as hardened programmable integrated circuit 10 is shown in FIG. 4. Hardened programmable logic device 10 may be formed partially from generic layers (e.g., generic programmable circuitry, programmable interconnects, programmable routing circuits, etc.) and partially from design-specific layers (e.g., custom layers that are specific to an individual custom logic design). Device 10 may include programmable circuits as well as hardened circuits (e.g., mask configured custom circuits). With this type of arrangement, a common set of generic fabrication masks (i.e., lithographic masks) may be used in production of all hardened programmable integrated circuits in a family of hardened programmable integrate circuits and as well as programmable integrated circuits in a family of programmable integrated circuits, thereby reducing manufacturing costs. In order to manufacture a hardened programmable logic device that implements a particular custom logic design, one or more custom fabrication masks that are associated with that custom logic design are also used in the manufacture of the hardened programmable logic devices.

Device 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines), hardened programmable interconnects (e.g., hardwired and/or bypassed programmable connections between respective interconnects), and programmable interconnects (i.e., programmable connections between respective interconnects that are programmable using configuration control signals). Hardened programmable logic 18 may include combinational and sequential logic circuitry. The hardened programmable logic 18 may be configured to perform a custom logic function (e.g., logic 18 may be configured by one or more custom mask layers, by configuration control signals, or by a combination of one or more custom mask layers and configuration control signals). The programmable interconnects and hardened programmable interconnects associated with interconnection resources may be considered to be a part of hardened programmable logic 18.

Device 10 may contain hardened programmable memory elements 20. Memory elements 20 may provide static control output signals that control the state of associated logic components in hardened programmable logic 18. The static control signals, in a given device 10, are determined by the particular custom logic design that that device 10 was manufactured to implement. The static control signals may be applied to the gates of metal-oxide-semiconductor (MOS) transistors. These transistors may include n-channel metal-oxide-semiconductor (NMOS) pass transistors in programmable components such as multiplexers and logic array blocks (LABs).

A typical memory element 20 is formed from a number of transistors configured to form cross-coupled inverters. In the context of hardened programmable logic device integrated circuits, the memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip.

When a memory element supplies a high output to an NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

The circuitry of device 10 may be organized using any suitable architecture. As an example, the logic of hardened programmable logic device 10 may be organized in a series of rows and columns of larger hardened programmable logic regions (and programmable logic regions) each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 5:
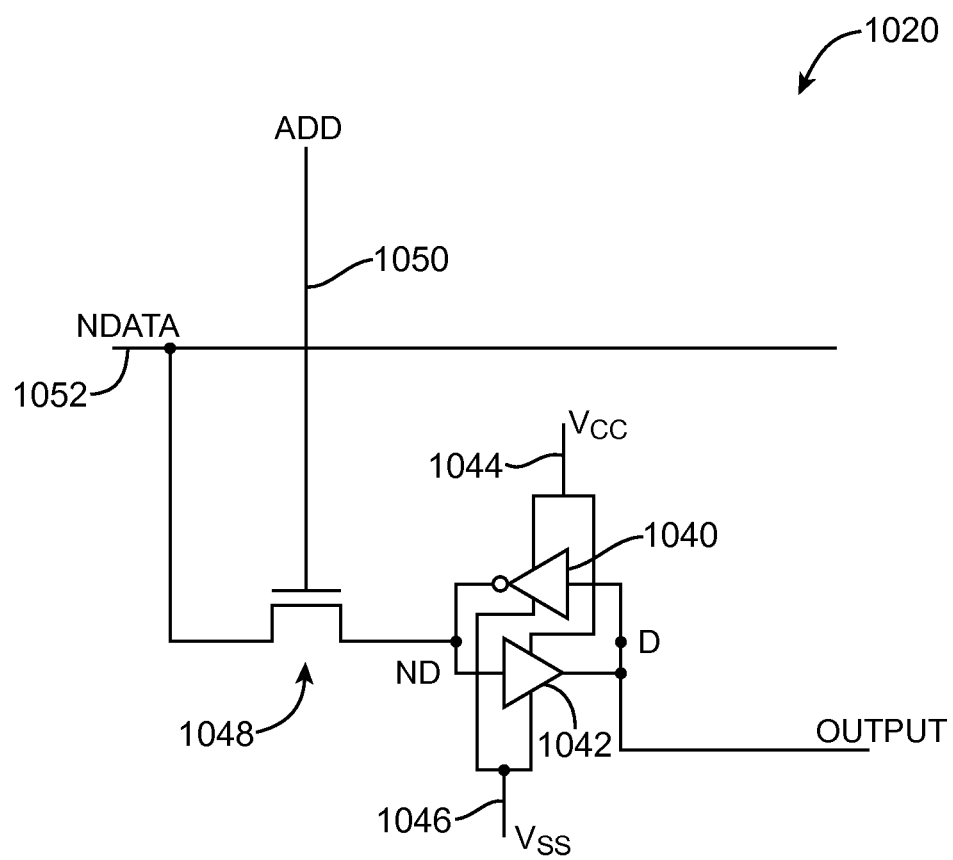
FIG. 5 is a diagram of a conventional configuration memory cell in a programmable logic device of the type shown in FIG. 1.

FIG. 5 shows a conventional configuration memory element 1020 in a programmable logic device 1010 of the type shown in FIG. 1. As shown in FIG. 5, configuration memory element 1020 includes two cross-coupled inverters 1040 and 1042. Each inverter is connected to positive power supply terminal 1044 and ground power supply terminal 1046. The input of inverter 1042 is connected to complement data node ND and has an output connected to true data node D. Inverter 1040 has its input connected to node D and its output connected to node ND. Address transistor 1048 is controlled by address signal ADD on address line 1050. Data line 1052 is connected to node ND via address transistor 1048. Data line 1052 is used to load data into memory element 1020 configuration operations.

During configuration operations, address signal ADD is asserted. This turns on address transistor 1048. In configuration operations, complementary data (NDATA) from line 1052 is driven onto node ND. If a logic one is driven onto node ND, memory element 1020 will be loaded with a logic zero and data node D will be low (at Vss). If a logic zero is driven onto node ND, memory element 1020 will be loaded with a logic one and data node D will be high (at Vcc). Conventional configuration memory elements sometimes include clear transistors connected between one of the data nodes of the elements and a clear line. The clear transistors are used to erase data from the elements prior to configuration operations.

Figure 6:
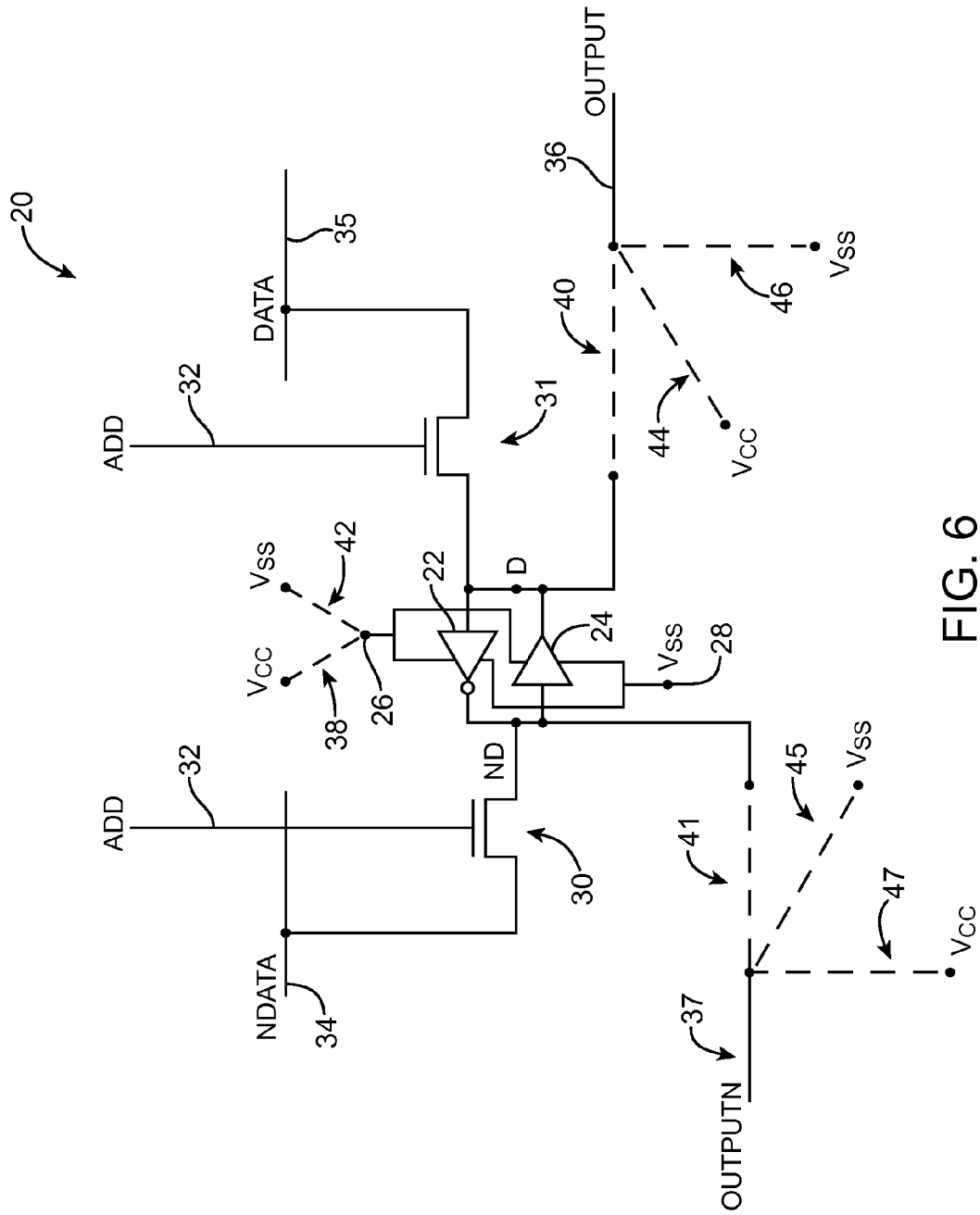
FIG. 6 is a diagram of an illustrative configuration memory cell that has been hardened and that may be included in a hardened programmable logic device of the type shown in FIG. 4 in accordance with an embodiment of the present invention.

The circuitry of an illustrative hardened configuration memory element 20 is shown in FIG. 6. The example of FIG. 6 uses a single address line and a single data line and uses a bistable element formed from a pair of cross-coupled inverters 22 and 24. This is merely illustrative. In general, memory elements 20 may be formed using any suitable architecture. The use of the arrangement of FIG. 6 is shown as an example. As an example, one or more generic fabrication masks (i.e., lithographic masks used in the manufacture of programmable logic devices and hardened programmable logic devices that implement a variety of custom logic designs) may be used to form structures such as address line 32, data line 34, transistor 30, inverters 22 and 24, and other components of cell 20 (e.g., components shown with solid lines, rather than dashed lines, in FIG. 6 may be formed using generic fabrications masks, if desired). One or more custom fabrication masks may be used to form structures in FIG. 6 (e.g., components shown with dashed lines, rather than solid lines, may be formed using custom fabrications masks).

As shown in FIG. 6, memory element 20 may contain two cross-coupled inverters 22 and 24. Each inverter may contain a p-channel metal-oxide-semiconductor transistor and an n-channel metal-oxide-semiconductor transistor connected in series between positive power supply terminal 26 and ground power supply terminal 28. The input of inverter 24 is connected to complement data node ND and has an output connected to true data node D. Inverter 22 has its input connected to node D and its output connected to node ND. Address transistor 30 is controlled by address signal ADD on address line 32. Data line 34 is connected to node ND via address transistor 30. Data line 34 may be used to load data into memory element 20 during write operations and may be used to convey data from memory element 20 to associated reading circuitry during data read operations.

When a memory element 20 is implemented as a programmable memory element, one or more generic fabrication masks (i.e., lithographic masks used in the manufacture of programmable logic devices) may be used to connect positive power supply terminal 26 to a positive power supply node Vcc (e.g., by closing dashed circuit 38) and to connect node D to output path 36 (e.g., by closing dashed circuit 40). With this type of arrangement, memory element 20 can be loaded with configuration data.

During read and write operations, address signal ADD is asserted. This turns on address transistor 30. In data write operations, complementary data (NDATA) from line 34 is driven onto node ND. If a logic one is driven onto node ND, memory element 20 will be loaded with a logic zero and data node D will be low (at Vss). If a logic zero is driven onto node ND, memory element 20 will be loaded with a logic one and data node D will be high (at Vcc). Once loaded with a configuration data bit, memory element 20 may output a corresponding high or low static control signal using output path 36.

When a memory element 20 is implemented as a hardened memory element, one or more custom fabrication masks (e.g., lithographic fabrication masks, each of which is specific to a particular user design) may be used to configure memory element 20. If desired, inverters 22 and 24 may be turned off (e.g., by closing dashed circuit 42 using a custom mask-programmed hardwired path and thereby connecting positive power supply terminal 26 to ground power supply node Vss to permanently depower memory element 20 or by leaving circuits 38 and 42 open) when memory element 20 is implemented as a hardened element 20 in hardened device 10. This type of arrangement may reduce the power consumption of device 10.

Each hardened programmable logic device may implement a single user design. Each user design may specify which memory elements 20 need to output a high static control signal and which memory elements 20 need to output a high static control signal. For the memory elements 20 that need to output a high static control signal, one or more custom fabrication masks may be used to connect output path 36 to a positive power supply node Vcc (e.g., by closing dashed path 44 and thereby configuring memory element 20 to output a high static control signal). For the memory elements 20 that need to output a low static control signal, the one or more custom fabrication masks may be used to connect output path 36 to a ground power supply node Vss (e.g., by closing dashed path 46 and thereby configuring memory element 20 to output a low static control signal).

With the arrangement described in FIG. 6, the power consumption of memory elements 20 can be reduced relative to non-hardened programmable logic devices and the output of the memory elements 36 can be made resistant to soft error upset events. If desired, some of the memory elements 20 in a hardened programmable device 10 may be hardened (e.g., in some elements 20 of device 10, path 42 may be closed to connect positive power supply terminal 26 to ground power supply terminal Vss and one of paths 44 and 46 may be closed) and some of the memory elements 20 in the device 10 may be programmable (e.g., in some elements 20 of device 10, paths 38 and 40 may be closed). This type of arrangement may provide device 10 with partial programmability (e.g., device 10 may be able to implement a plurality of user designs, which may be somewhat related and have common programmed circuits that do not change between the designs).

Memory elements such as element 20 may be arranged in an array on integrated circuit 10. In a typical arrangement, there are thousands or millions of elements 20 on a given integrated circuit 10. The memory elements 20 in the array form rows and columns. Address lines 32 and data lines 34 may be associated with different rows and columns of elements in the array and may be used to control read and write operations for the elements (e.g., read and write operations for memory elements 20 that are programmable).

If desired, memory elements 20 may implement differential data reading schemes and may implement differential data writing schemes. In differential data writing schemes and data reading schemes, each memory element 20 may include a pair of address transistors such as address transistors 30 and 31 that are control by address signals on one or more address lines 32. Address transistor 30 may be connected between complement data node ND and complement data line 34 (NDATA) and address transistor 31 may be connected between data node D and data line 35 (DATA). Memory elements 20 may, if desired, include one or more clear transistors connected between data nodes and a clear line. The clear transistors may be used used to erase data from the elements 20 prior to configuration operations.

Memory elements 20 may, if desired, include complement data output 37 (OUTPUTN) in addition to or instead of data output 36 (OUTPUT). In arrangements in which it is desired to have complement data output 37 be the complement (i.e., logic opposite) of data output 37, path 41 may be closed when path 40 is closed (e.g., when path 38 is closed and paths 42, 44, 45, 46, and 47 are open), path 45 may be closed when path 44 is closed (e.g., when path 42 is closed and paths 38, 40, 41, 46, and 47 are open), and path 47 may be closed when path 46 is closed (e.g., when path 42 is closed and paths 38, 40, 41, 44, and 45 are open), as examples. If desired, memory element 20 may be configured such that data output 37 is independent of data output 36 (e.g., such that only one of paths 41 and 40 is closed, path 44 is closed while path 47 is closed, path 46 is closed while path 45 is closed, etc.).

Figure 7:
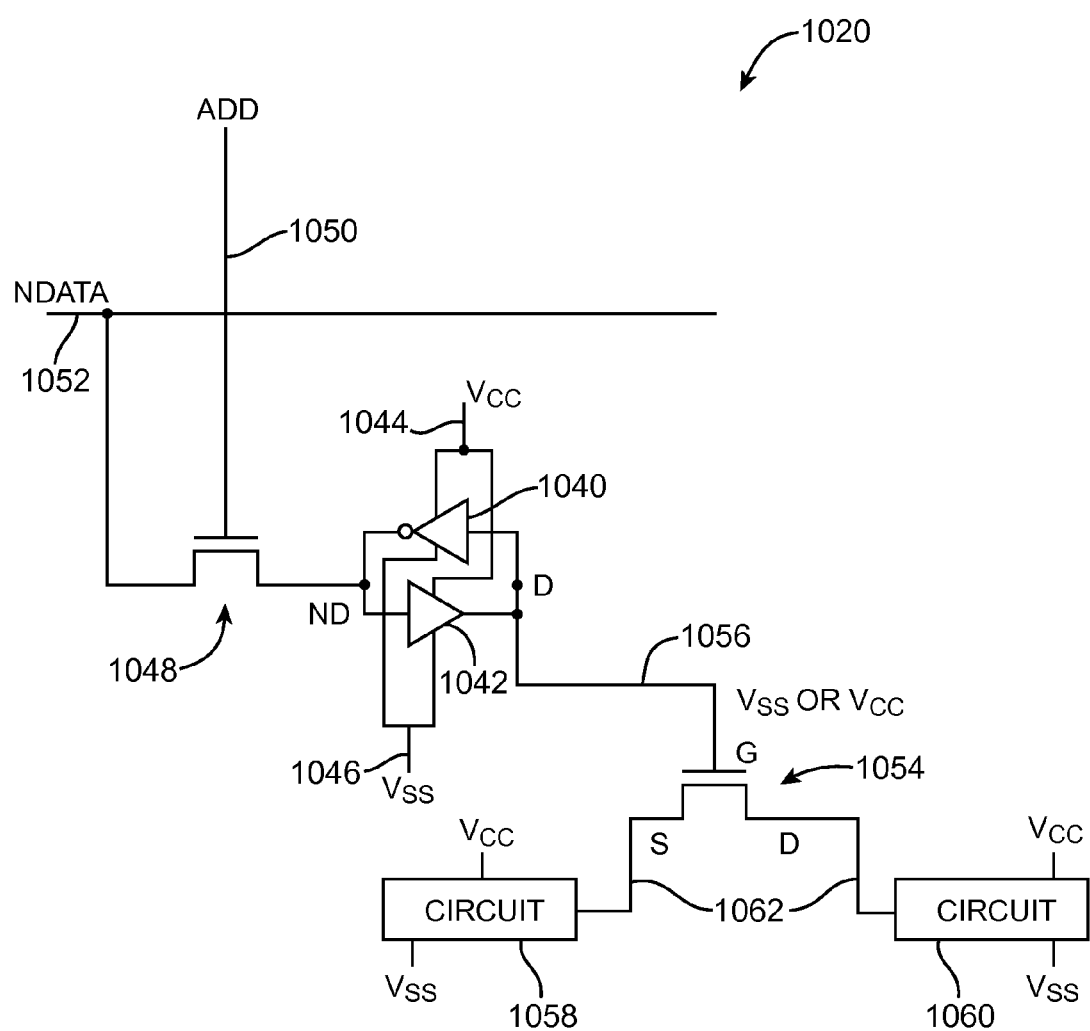
FIG. 7 is a diagram of a conventional configuration memory cell, pass gate, and circuitry in a programmable logic device of the type shown in FIG. 1.

As shown in FIG. 7, once loaded with a configuration data bit, conventional memory element 1020 supplies a corresponding high or low static control signal to an associated programmable logic transistor 1054 using path 1056. If the value of D on gate G of transistor 1054 is low, transistor 1054 will be turned off. In this situation, source S and drain D of transistor 1054 will be isolated from each other and no signals will pass from circuit 1058 to circuit 1060. If the value of D on gate G of transistor 1054 is high, transistor 1054 will turn on, shorting paths 1062 to each other. This allows signals from circuit 1058 to pass to circuit 1060 via paths 1062 and transistor 1054.

Figure 8:
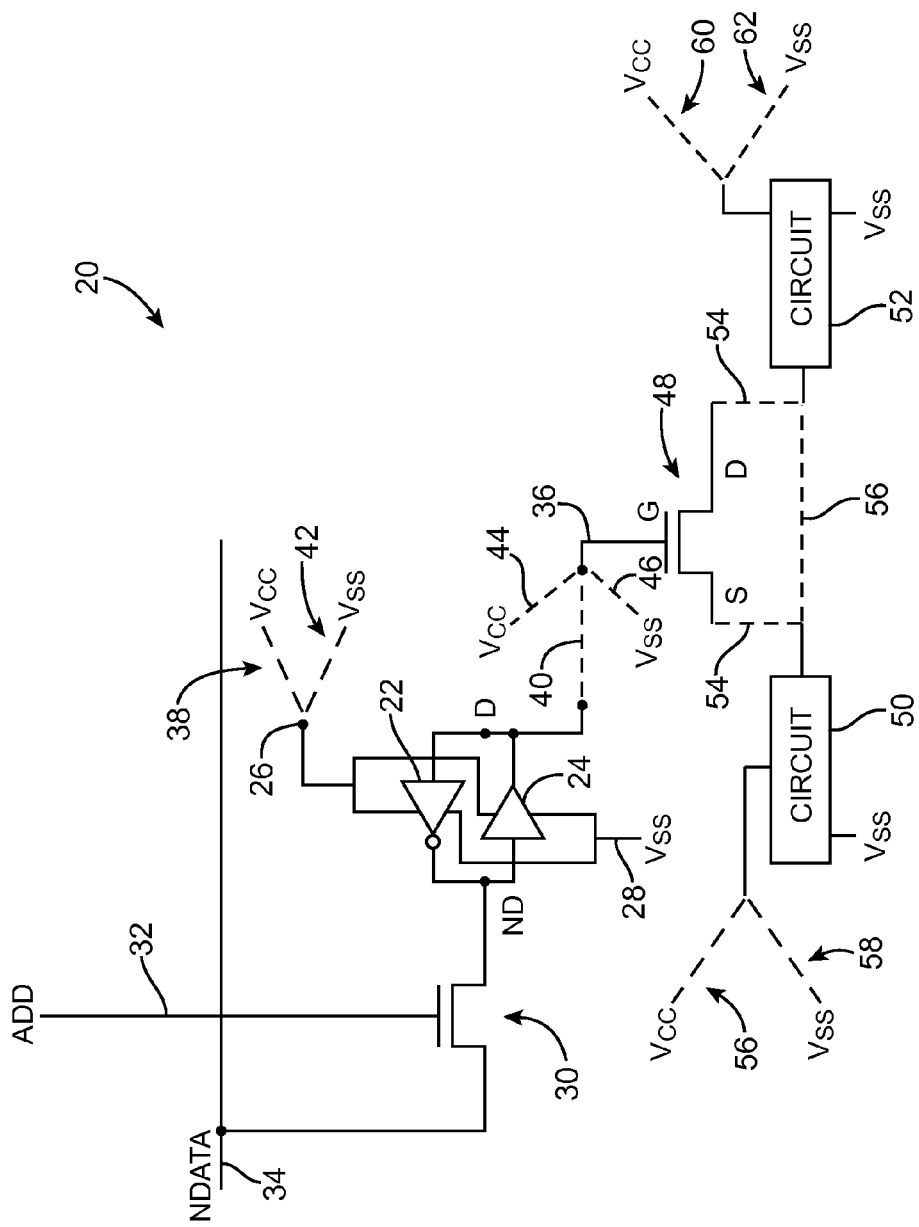
FIG. 8 is a diagram of illustrative circuitry such as a configuration memory cell, a pass gate, and a pair of circuits that may be included in a hardened programmable logic device of the type shown in FIG. 4 in accordance with an embodiment of the present invention.

As shown in FIG. 8, memory elements 20 may be used in selectively isolating and connecting together circuits 50 and 52. As an example, one or more generic fabrication masks may be used to form structures such as address line 32, data line 34, transistor 30, inverters 22 and 24, circuits 52 and 52, transistor 48, and other components shown in FIG. 8 (e.g., components shown with solid lines, rather than dashed lines, in FIG. 8 may be formed using generic fabrications masks, if desired). One or more custom fabrication masks may be used to form structures in FIG. 8 (e.g., components shown with dashed lines, rather than solid lines, may be formed using custom fabrications masks).

When a memory element 20 is implemented as a programmable memory element (e.g., when paths 38, 40, and 54 are closed), the output of the memory element 20 is provided to gate G of transistor 48 over paths 36 and 40. If the value of D on gate G of transistor 48 is low, transistor 48 will be turned off. In this situation, source S and drain D of transistor 48 will be isolated from each other and no signals will pass from circuit 50 to circuit 52. If the value of D on gate G of transistor 48 is high, transistor 48 will turn on, shorting paths 54 to each other. This allows signals from circuit 50 to pass to circuit 52 via paths 54 and transistor 48.

When a memory element 20 is implemented as a hardened memory element (e.g., when path 42 is closed), transistor 48 may be used in opening and closing the path between circuits 50 and 52, bypass path 56 may be used in opening and closing the path between circuits 50 and 52, and, if circuits 50 and 52 are not active, circuits 50 and 52 may be turned off (during operation of device 10).

When device 10 is a hardened device, it may be desirable to have certain signal paths be maintained in such a way that signal timing is not affected by implementing a circuit design on the hardened device 10, relative to arrangements in which the same circuit design is implemented on a programmable device. With this type of arrangement, signal timing between circuits 50 and 52 may be maintained by closing one of paths 44 and 46 (e.g. to turn on or turn off transistor 48 as needed), by closing paths 54, and by leaving bypass path 56 open. In this configuration, signals passing from circuit 50 to circuit 52 still pass through transistor 48 (as they would if the circuit design were implemented in a programmable device) and signal timing between circuits 50 and 52 is maintained. This type of arrangement may be beneficial when it is desired to test a given circuit design using a programmable logic device and then manufacture hardened devices 10 that maintain the same signal timing characteristics as the programmable logic device implementation.

When device 10 is hardened device and the signal path between circuits 50 and 52 is not timing critical (e.g., the timing constraints of the path between circuits 50 and 52 are relatively loose), bypass path 56 may be formed using one or more custom fabrication masks. In this configuration, path 42 may be closed and paths 40, 44, 46, and 54 may be left open (as examples).

In user designs in which circuit 50 is active, a custom mask may form path 56 to power circuit 50. In user designs in which circuit 50 is inactive, a custom mask may form path 58 to turn off circuit 50. Similarly, a custom mask may form path 60 or path 62 to selectively turn on or turn off circuit 52.

In arrangements in which memory elements include complement data output 37 (as described in connection with FIG. 6), device 10 may include pass transistors and other programmable elements programmable using complement data output 37 of elements 20 in addition to or instead of using data output 36 of elements 20.

Figure 9:
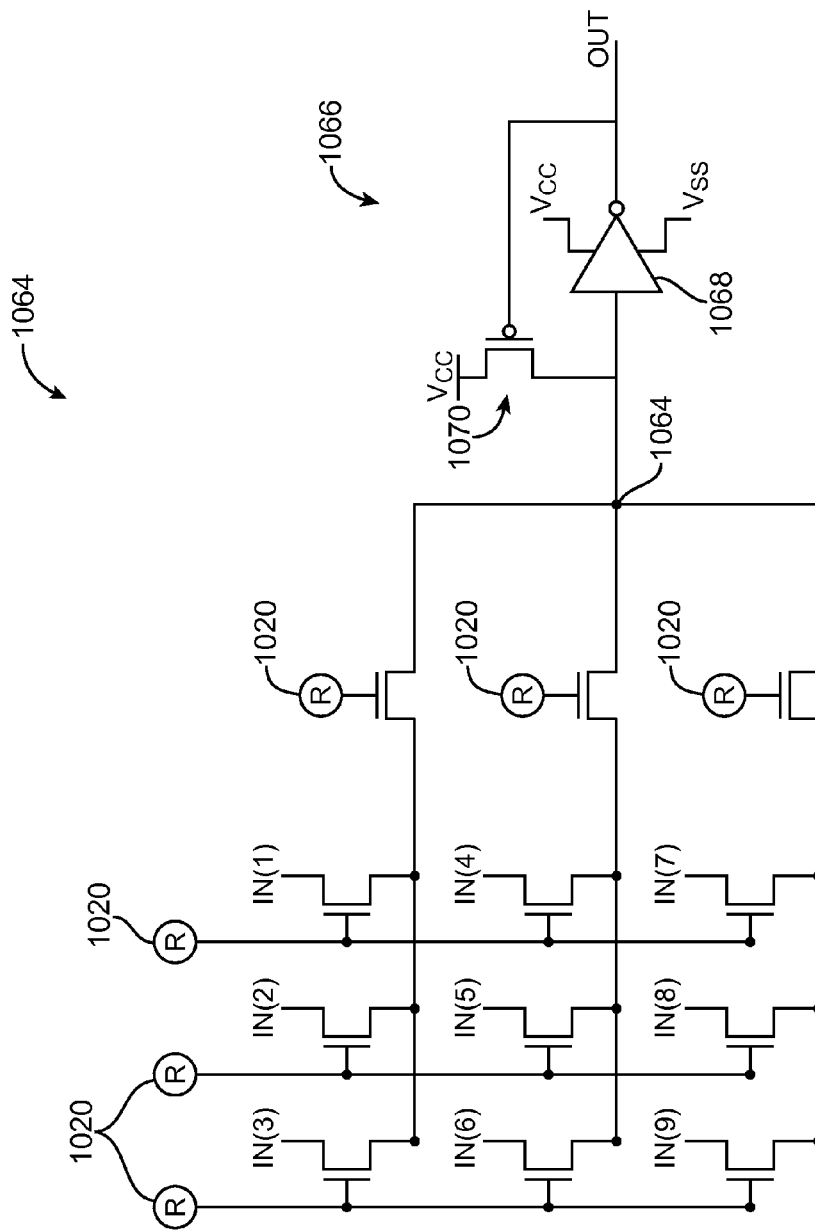
FIG. 9 is a diagram of a conventional routing multiplexer in a programmable logic device of the type shown in FIG. 1.

FIG. 9 shows a conventional routing multiplexer 1064 in a programmable logic device 1010 of the type shown in FIG. 1. As shown in FIG. 9, multiplexer 1064 includes nine input lines (IN(1) to IN(9)) and a plurality of transistors controlled by configuration memory elements 1020. Based on the logic values stored in the configuration memory elements 1020, multiplexer 1064 selectively connects a single input line to node 1064. Level recovery and inverter circuit 1066, which includes inverter 1068 and transistor 1070, may invert the signal on node 1064 and output either a logic high signal (Vcc) or a logic low signal (Vss), depending on the logic value conveyed on the selected input line.

Figure 10:
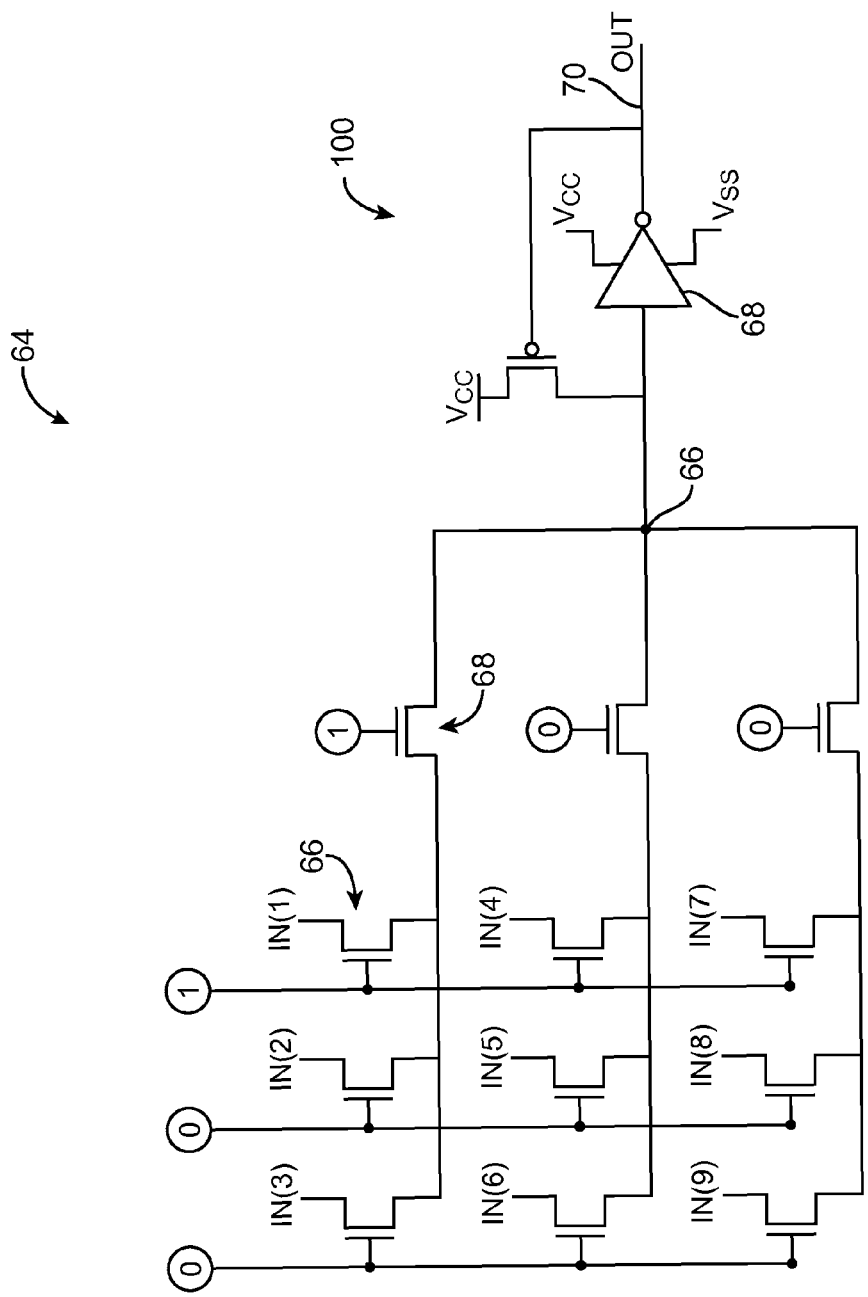
FIG. 10 is a diagram of an illustrative multiplexer that may be hardened to route a selected input to an output path and that may be included in a hardened programmable logic device of the type shown in FIG. 4 in accordance with an embodiment of the present invention.

As shown in FIG. 10, hardened programmable device 10 may include a multiplexer such as multiplexer 64. Multiplexer 64 may include level recovery and inverter circuit 100 and transistors that can be formed from one or more generic fabrication masks (e.g., fabrication masks that may be used in manufacturing programmable devices and hardened programmable devices that implement a variety of user designs). In general, multiplexers in device 10 such as multiplexer 64 may have any number of input lines.

Multiplexer 64 may be hardwired to connect a particular input to node 66. In the example of FIG. 10, signals are routed from input terminal IN(1) through transistors 66 and 68, through node 66, and through inverter 68 to output 70. As one example, the transistors of multiplexer 64 may have gate terminals that are directly connected to a positive power supply terminal Vcc (i.e., "1" in FIG. 10) or that are directly connected to a ground power supply terminal Vss (i.e., "0" in FIG. 1) and multiplexer 64 may therefore be hardwired to route a selected input terminal to output 70.

Figure 11:
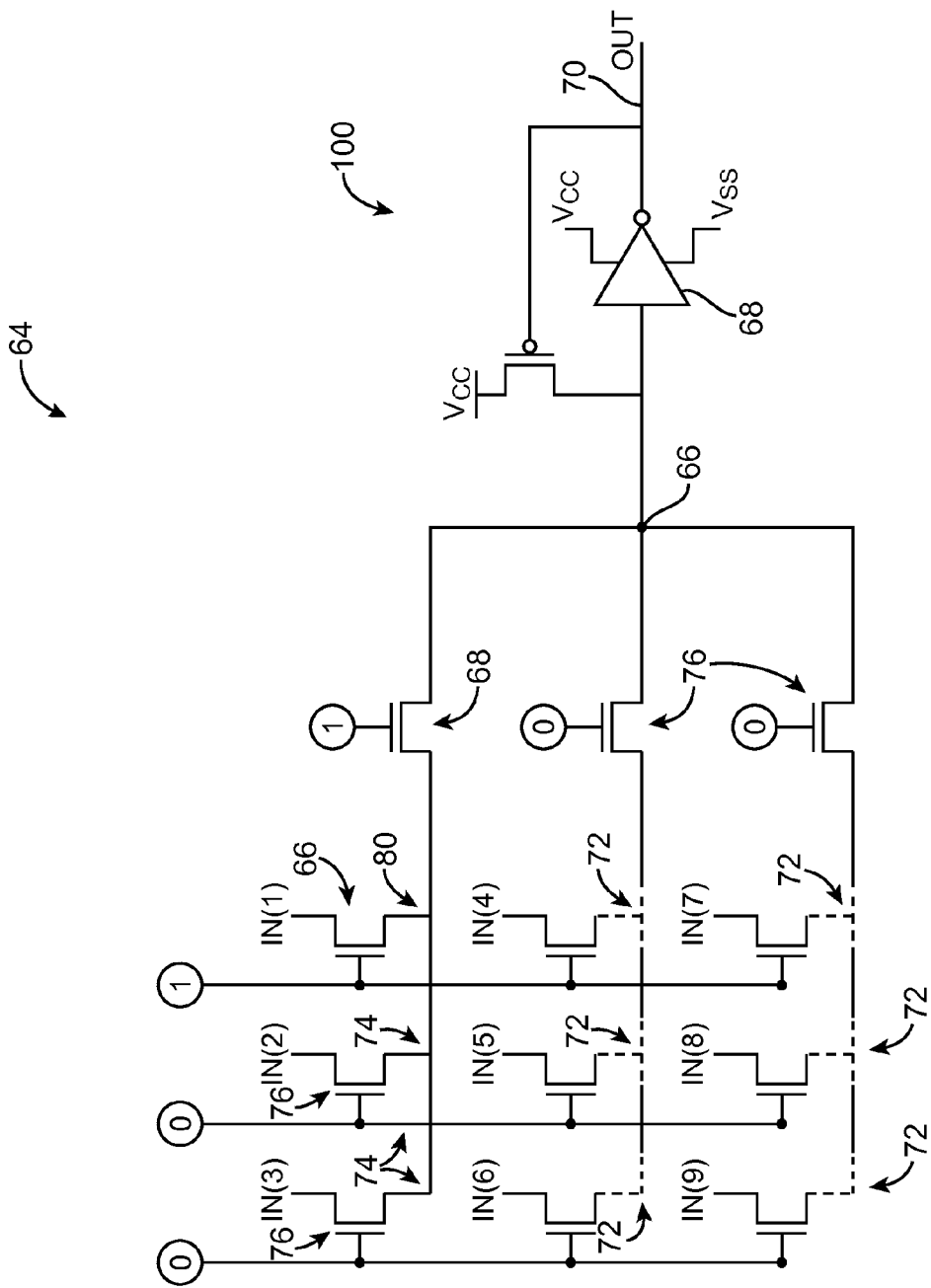
FIG. 11 is a diagram of an illustrative multiplexer that may be hardened to route a selected input to an output, in which paths that do not load the path between the selected input and the output may be disabled, and that may be included in a hardened programmable logic device of the type shown in FIG. 4 in accordance with an embodiment of the present invention.

If desired, some or all of the transistors that are not in the path between the selected signal input and the output of multiplexer 64 (e.g., the active signal path) may be disconnected. When it is desired to maintain signal timing characteristics between a user design implemented on a programmable logic device and the same user design implemented on hardened programmable device 10, transistors that place a load on or otherwise effect active signal paths may remain connected, while other transistors may be disconnected. For example, as shown in FIG. 11, when input IN(1) is being routed to node 66, paths 74 and 80 may be closed and paths 72 may be open (e.g., a custom fabrication mask may be used to close paths 74 and 80 while leaving paths 72 open). With this type of arrangement, transistors 76, which may place loads on transistor 66 and node 66 that effect signals passing from input IN(1) to node 66, may remain connected to the path between input IN(1) to node 66 (e.g., the active signal path).

Figure 12:
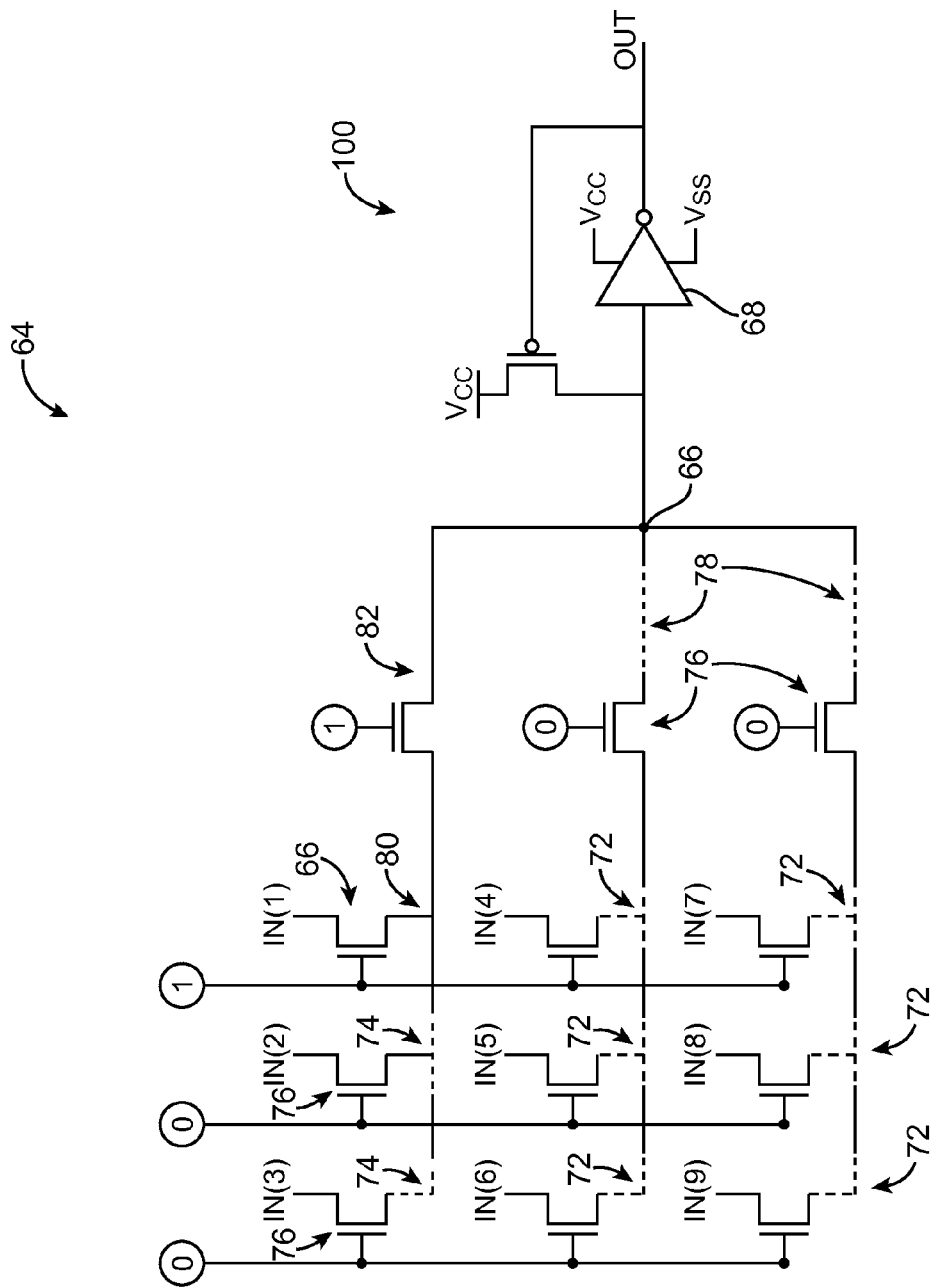
FIG. 12 is a diagram of an illustrative multiplexer that may be hardened to route a selected input to an output, in which paths that are not between the selected input and the output may be disabled, and that may be included in a hardened programmable logic device of the type shown in FIG. 4 in accordance with an embodiment of the present invention.

When it is desired to disconnect all of the transistors that are not in the path between the selected signal input and the output of multiplexer 64, paths 72, 74, and 78 may be opened (e.g., a fabrication mask may be used to close paths 80 and 82 while leaving paths 72, 74, and 78 open) as shown in the example of FIG. 12.

Figure 13:
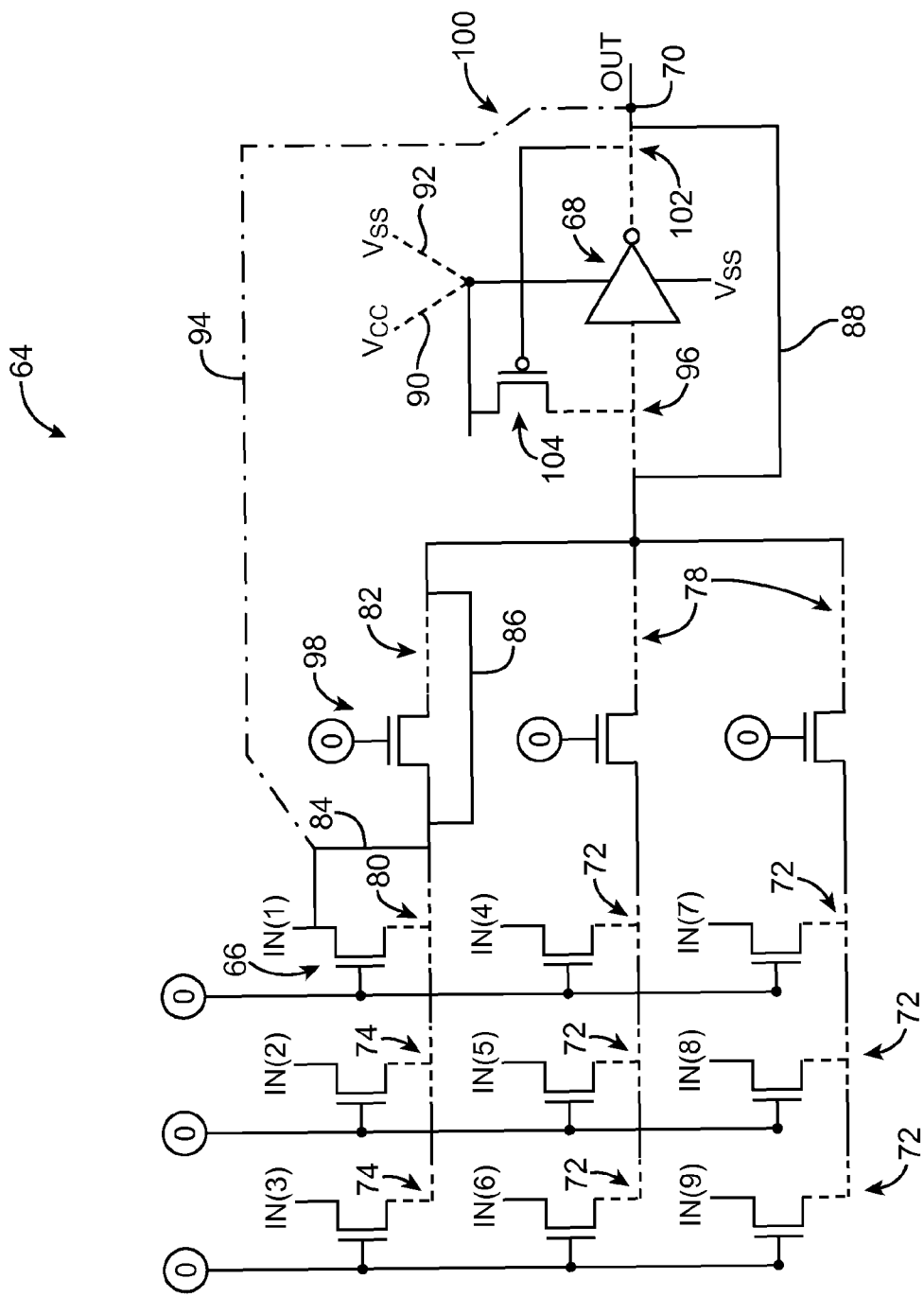
FIG. 13 is a diagram of an illustrative multiplexer that may be hardened to route a selected input to an output, in which some or all of the path between the selected input and the output may be bypassed, and that may be included in a hardened programmable logic device of the type shown in FIG. 4 in accordance with an embodiment of the present invention.

With other suitable arrangements, one or more of the transistors in the path between the selected signal input and the output of multiplexer 64 (e.g., the active signal path) may be bypassed. As examples, which are shown in FIG. 13, bypass path 84 may be closed to bypass transistor 66 (if desired, path 80 may be open to disconnect transistor 66), bypass path 86 may be closed to bypass transistor 98 (if desired, path 82 may be open to disconnect transistor 98), bypass path 88 may be closed to bypass level recovery and inverter circuit 100 (if desired, paths 96 and 102 may be open to disconnect circuit 100), and bypass path 94 may be closed to directly connect the selected input (IN(1) in the FIG. 13 example) to output 70 (if desired, paths 80, 84, 88, and 102 may be open). These are merely illustrative examples.

When level recovery and inverter circuit 100 is active (e.g., when circuit 100 is in the path between the selected input and output 70), path 90 may be closed to route positive power supply voltage Vcc to inverter 68 and transistor 104. When level recovery and inverter circuit 100 is inactive (e.g., when bypass path 88 or 94 is closed or when multiplexer 64 is not used in the custom circuit design implemented by device 10), path 92 may be closed to route ground power supply voltage Vss to transistor 104 and inverter 68, thereby turning off level recovery and inverter circuit 100. The bypass paths and paths of FIG. 13 may be opened and closed using custom fabrication masks that are unique to a specific custom logic circuit (i.e., user design).

As an example, one or more generic fabrication masks may be used to form structures in FIGS. 10, 11, 12, and 13 such as transistors, inverters, and some routing lines of multiplexer 64 (e.g., components shown with solid lines, rather than dashed lines, may be formed using generic fabrications masks, if desired). One or more custom fabrication masks may be used to form structures in FIGS. 10, 11, 12, and 13 (e.g., components shown with dashed lines, rather than solid lines, may be formed using custom fabrications masks).

Figure 14:
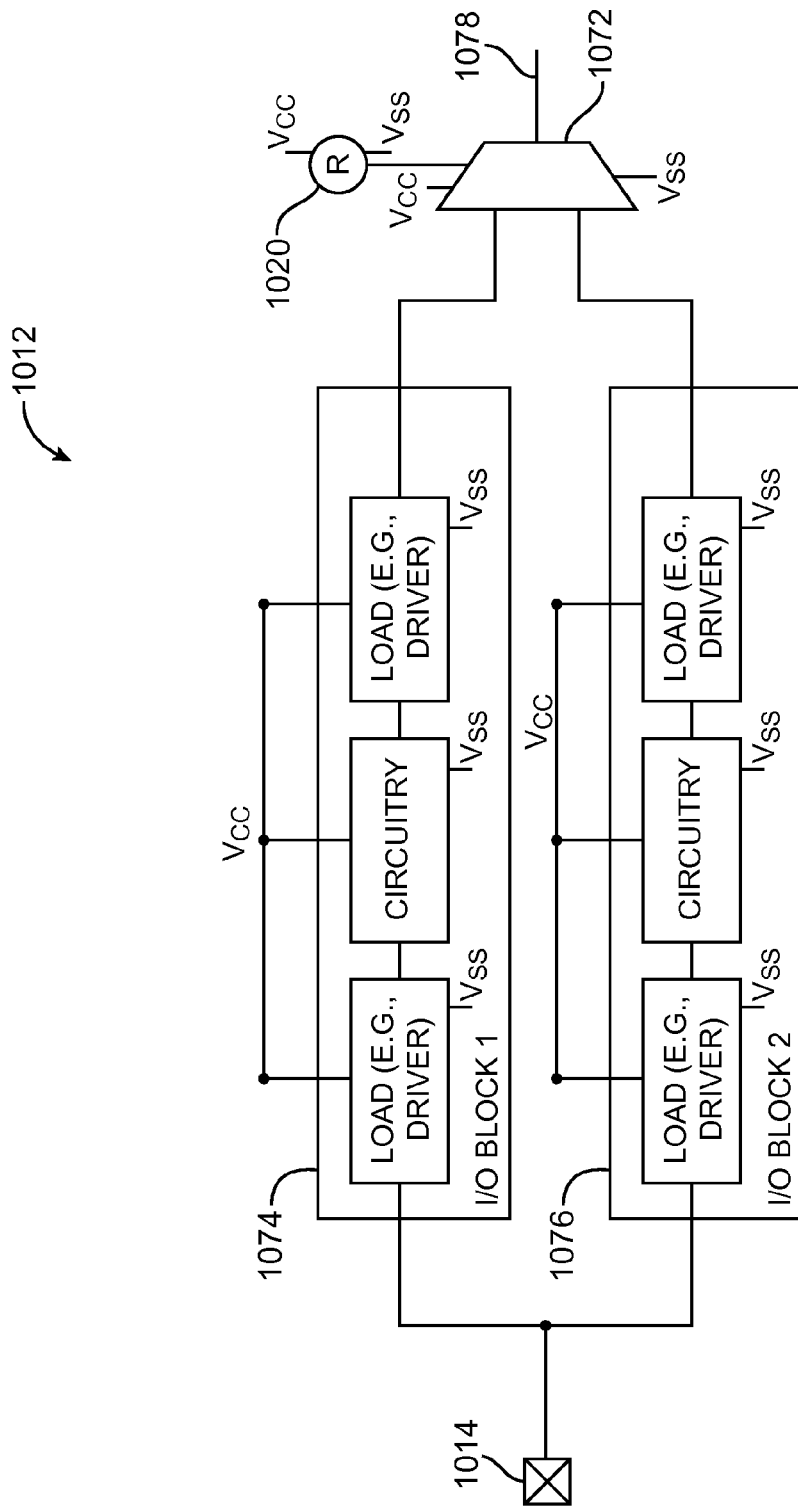
FIG. 14 is a diagram of conventional programmable input-output circuitry in a programmable logic device of the type shown in FIG. 1.

FIG. 14 shows conventional input-output circuitry 1012 that is used by programmable logic device 1010 of FIG. 1 to receive signals from external circuits over pin 1014 and transmit signals to the external circuits over pin 1014. Because programmable logic device 1010 supports multiple input-output standards, programmable logic device 1010 includes multiple blocks of input-output circuitry such as I/O BLOCK 1 and I/O BLOCK 2, which support different input-output standards. Programmable device 1010 uses multiplexer 1072, which is controlled by a configuration memory element 1020, to selectively route signals between one of the input-output blocks 1074 and 1076 and path 1078 (which is in turn connected to other components in device 1010). Because both input-output blocks 1074 and 1076 are powered, the power consumption of programmable device 1010 is increased relative to custom integrated circuit arrangements in which additional unused input-output blocks are not provided.

With hardened programmable devices such as device 10 of FIG. 4, unused input-output blocks can be disabled. If desired, signal timing characteristics may be maintained relative to arrangements implemented in programmable logic devices.

Figure 15:
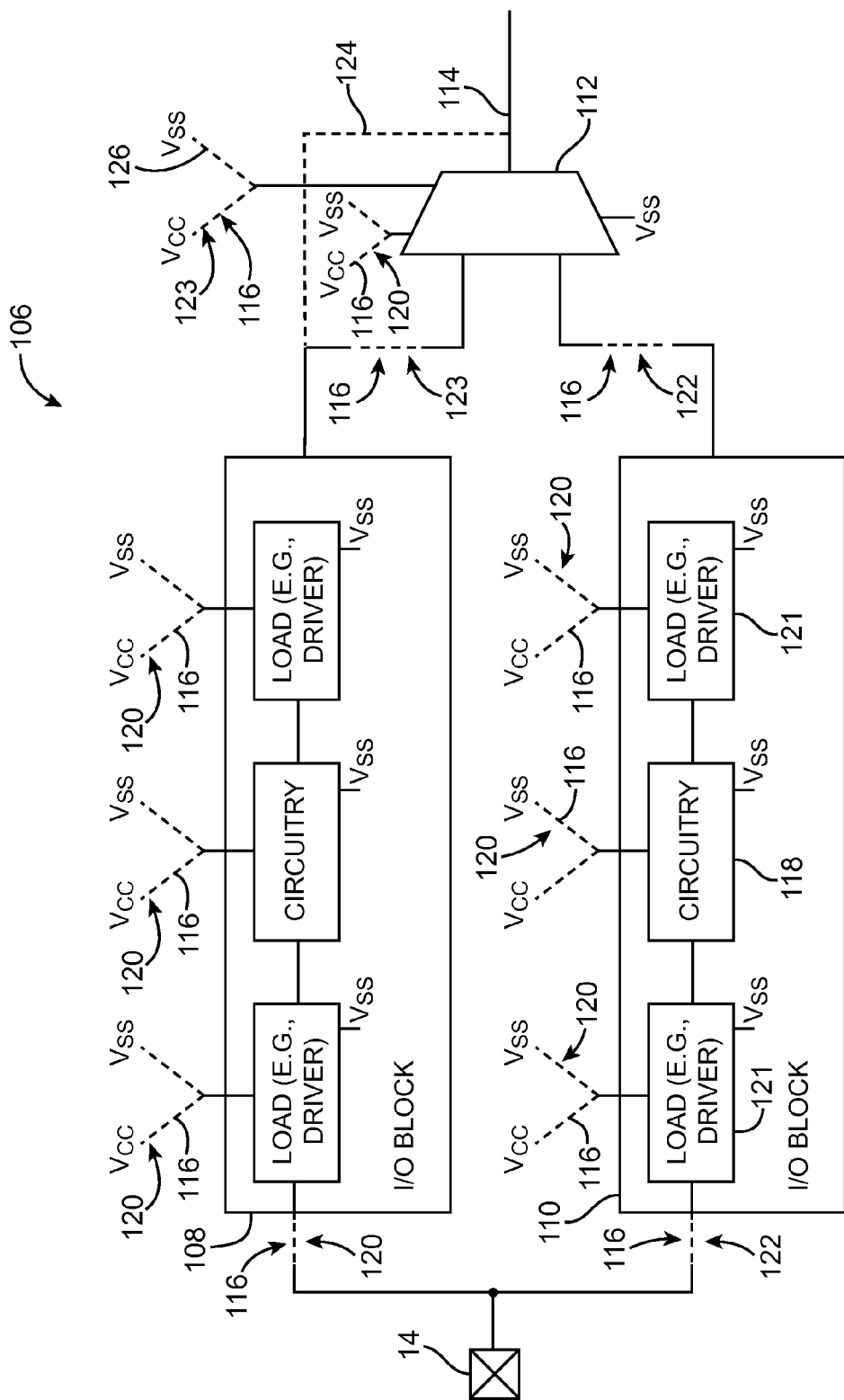
FIG. 15 is a diagram of illustrative input-output circuitry that may be included in a hardened programmable logic device of the type shown in FIG. 4 in accordance with an embodiment of the present invention.

As shown in FIG. 15, device 10 may include input-output circuitry 106 that includes input-output blocks 108 and 110 connected through multiplexer 112 to node 114. Input-output circuitry 106 may be used in receiving signals from external circuits over pin 14 and transmitting signals to external circuits over pin 14. Input-output circuitry 106 may be fabricated using one or more generic masks (e.g., masks that are also used to manufacture programmable logic devices or hardened programmable logic devices that implement other user designs) and one or more custom masks. Hardened programmable device 10 may implement one of input-output block 108 and input-output block 110. Alternatively, hardened programmable device 10 may not implement either of the input-output blocks 108 or 110. With these types of arrangements, the custom masks may be used in enabling and disabling the input-output blocks.

As an example, one or more generic fabrication masks may be used to form structures such as input-output blocks 108 and 110, pin 14, multiplexer 112, and other components shown in FIG. 15 (e.g., components shown with solid lines, rather than dashed lines, in FIG. 15 may be formed using generic fabrications masks, if desired). One or more custom fabrication masks may be used to form structures in FIG. 15 (e.g., components shown with dashed lines, rather than solid lines, may be formed using custom fabrications masks).

When it is desired to maintain signal timing characteristics between a user design implemented on a programmable logic device and the same user design implemented on hardened programmable device 10, loads and transistors that place a load or otherwise effect active signal paths may remain connected, while other loads and transistors may be disconnected. As an example, if input-output block 108 is active and block 110 is inactive, paths 116 may be closed (using a custom fabrication mask) to turn off circuitry 118 in block 110, direct multiplexer 112 to route signals between node 114 and block 108, and provide positive power (Vcc) to block 108, multiplexer 112, and loads 121 in block 110.

In other arrangements (e.g., when it may be ok to alter signal timing characteristics), unused circuits and loads may be disabled and disconnected from the active signal path (e.g., the path through pin 14 and block 108 to multiplexer 112 when block 108 is active). As an example, paths 120 and 123 may be closed and paths 122 may remain open, thereby disabling and disconnecting block 110 while connecting and enabling block 108. As another example, paths 123 may remain open, while path 124 is closed, thereby bypassing multiplexer 112 (if desired, path 126 may be closed to shut off power to multiplexer 112).

Figure 16:
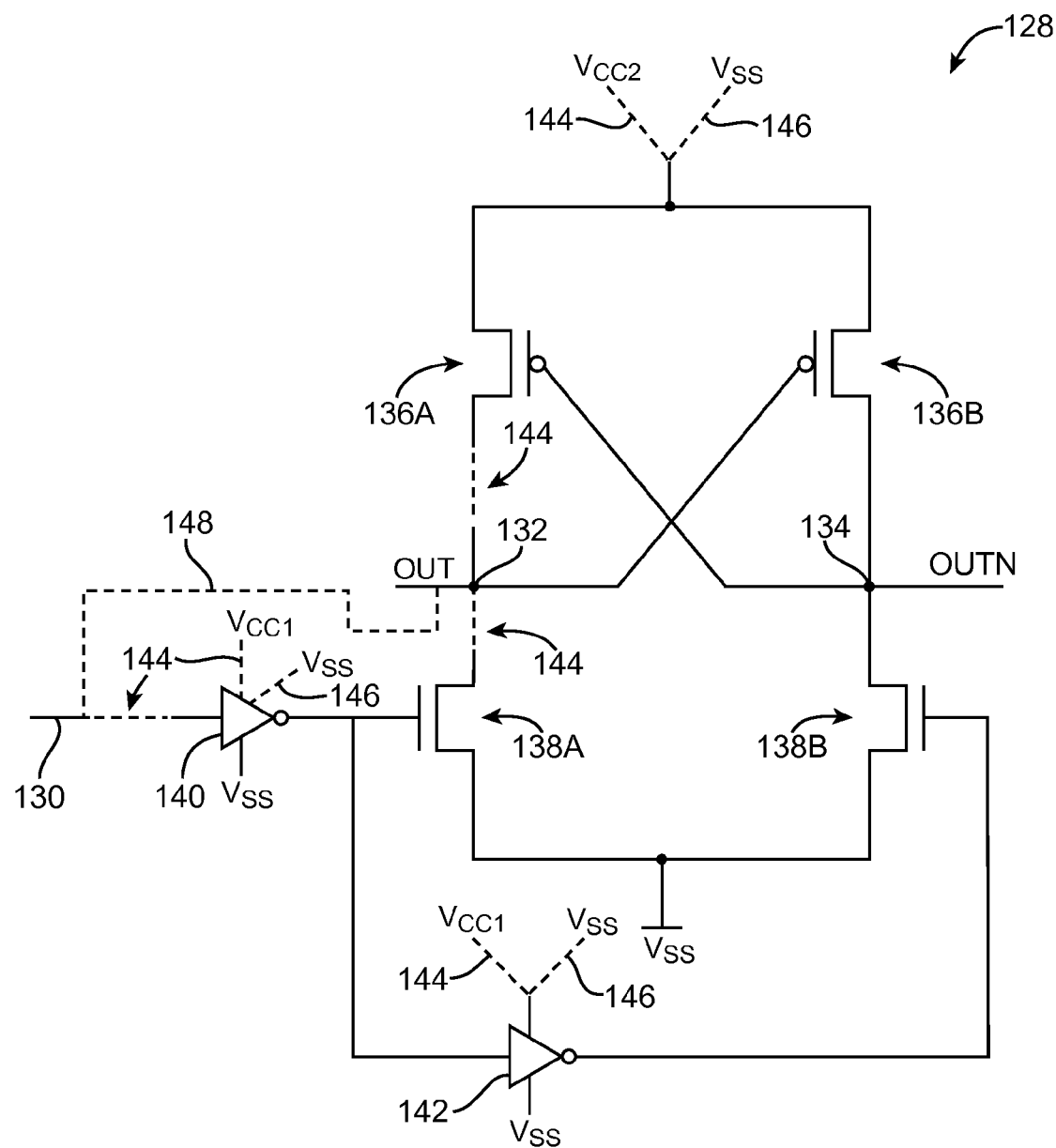
FIG. 16 is a diagram of illustrative level shifter circuitry that may be included in a hardened programmable logic device of the type shown in FIG. 4 in accordance with an embodiment of the present invention.

As shown in FIG. 16, device 10 may include level shifter circuitry 128 that converts a signal from a first voltage level to a second voltage level. As an example, level shifter circuit may include transistors 136A and 136B (e.g., p-channel transistors), transistors 138A and 138B (e.g., n-channel transistors), input-buffer and inverter 140, and inverter 142.

One or more generic fabrication masks may be used to form structures such as transistors 136A, 136B, 138A, and 18B, inverters 140 and 142, and other components shown in FIG. 16 (e.g., components shown with solid lines, rather than dashed lines, in FIG. 16 may be formed using generic fabrications masks, if desired). One or more custom fabrication masks may be used to form structures in FIG. 16 (e.g., components shown with dashed lines, rather than solid lines, may be formed using custom fabrications masks).

With one suitable arrangement, if a logic high signal at voltage level Vcc1 is received on input node 130 of level shifter circuit 128, output node 132 of circuit 128 outputs a logic high signal at voltage level Vcc2 (and complementary output node 134 outputs a logic low signal at voltage Vss). Conversely, if a logic low signal at voltage level Vss is received on input node 130 of circuit 128, output node 132 of circuit 128 outputs a logic low signal at voltage level Vss (and complementary output node 134 outputs a logic high signal at voltage Vcc2).

Level shifter circuitry 128 may be fabricated using one or more generic masks (e.g., masks that are also used to manufacture programmable logic devices or hardened programmable logic devices that implement other user designs) and one or more custom masks (e.g., masks that are used to manufacture hardened programmable devices that implement a specific user design). In the specific custom logic design implemented by hardened programmable device 10, level shifter circuitry 128 may be used (e.g., Vcc1 may be different from Vcc2 and/or an inverted version of the input signal on node 130 may be needed on complementary node 134) or may be unused (e.g., Vcc1 may be equal to Vcc2 and/or no signals may pass through circuit 128).

When level shifter circuit 128 is used in the specific user design implemented by a hardened programmable device 10, custom masks may be used to close paths 144. When paths 144 are closed, transistors 136A and 136B may be connected to a positive power supply line carrying voltage Vcc2, output node 132 may be connected between transistors 136A and 138B, input node 130 may be connected to inverter 144, and inverters 140 and 142 may receive and be powered by a positive power supply voltage Vcc1. When it is desired to maintain signal timing characteristics between a user design implemented on a programmable logic device and the same user design implemented on hardened programmable device 10, this type of arrangement, in which paths 144 are closed, may be used even when Vcc1 is equal to Vcc2. The arrangement in which paths 144 are closed may also be used when Vcc1 is equal to Vcc2 and an inverted version of the input signal on node 130 is required (e.g., regardless of whether or not it is desired to maintain signal timing characteristics).

In arrangements in which no signals pass through level shifter circuitry 128, custom masks may be used to close paths 146 while leaving paths 144 open.

In arrangements in which signals pass through level shifter circuitry 128 and in which Vcc1 is approximately equal to Vcc2 (e.g., no level shifting is needed), custom masks may be used to close bypass path 148, close paths 146, and leave paths 144 open (e.g., when it may be ok to alter signal timing characteristics).

Figure 17:
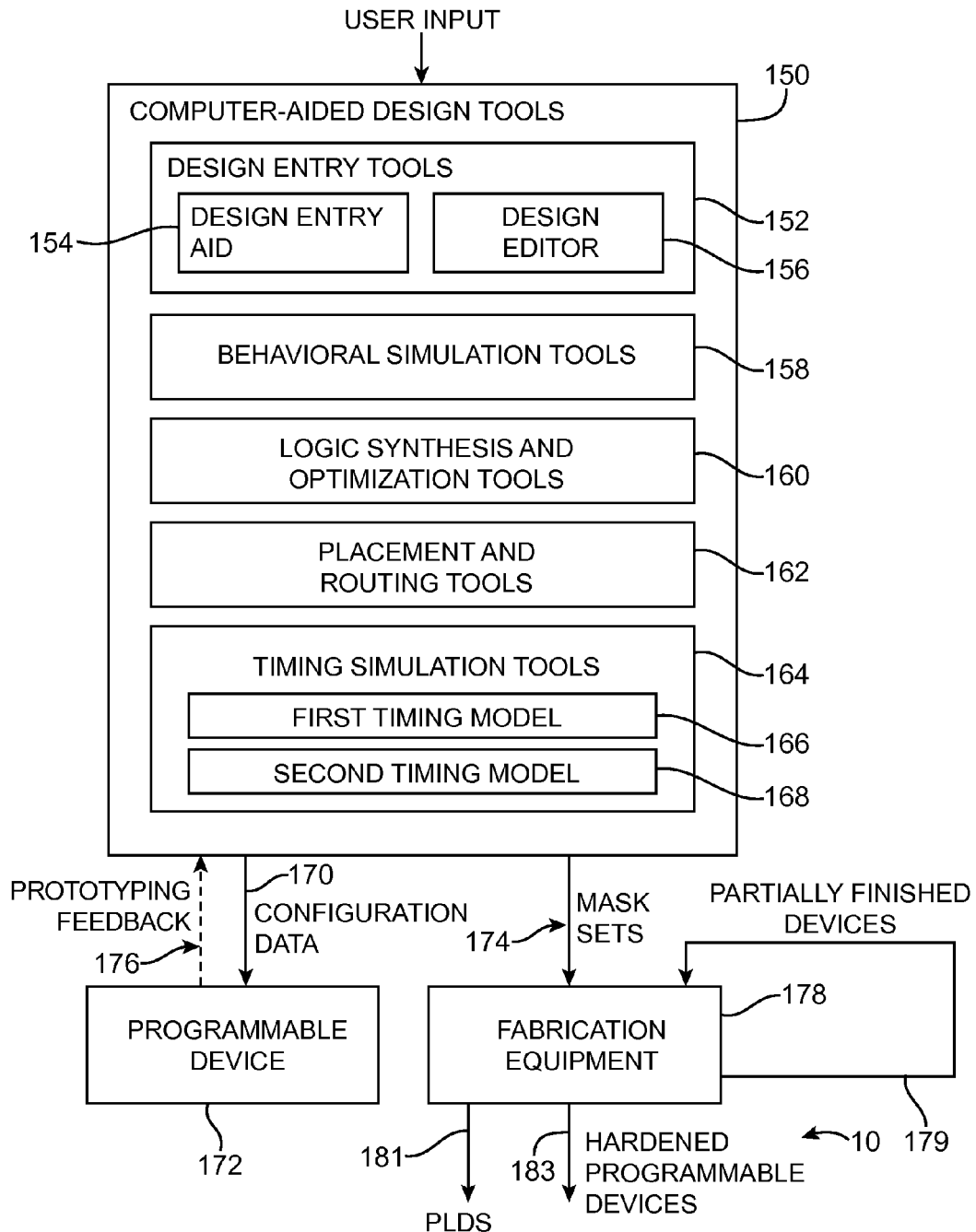
FIG. 17 is a diagram showing how computer-aided design tools may be used to create a logic design based on user input, may be used to create optional configuration data for configuration programmable logic devices, and may be used to create mask set information for manufacturing hardened programmable logic devices in accordance with the present invention.

Computer-aided design tools such as tools 150 of FIG. 17 may be used to produce masks sets for hardened programmable logic device 10 (e.g., as specifications for lithographic mask sets for semiconductor fabrication of a desired integrated circuit) and optional configuration data for hardened programmable logic devices with non-hardened configuration memory elements and for programmable logic devices from a set of design specifications or other suitable input. Tools such as tools 150 can also be used to generate output in other suitable formats.

The design process typically starts with the formulation of logic circuit functional specifications. A logic designer can specify how a desired circuit should function using design entry tools 152. Design entry tools 152 may include tools such as design entry aid 154 and design editor 156. Design entry aids 154 help a logic designer locate a desired design from a library of existing logic designs and may provide computer-aided assistance to the logic designer for entering (specifying) the desired design. As an example, design entry aid 154 may be used to present screens of options for a user. Design editor 156 may be used to enter a design (e.g., by entering lines of hardware description language code), may be used to edit a design obtained from a library (e.g., using a design entry aid), or may assist a user in selecting and editing appropriate prepackaged code/designs.

Design entry tools 152 may be used to allow a logic designer to provide a desired logic design to logic system 150 using any suitable format. For example, design entry tools 152 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 152 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 152 may allow the logic designer to provide a logic design to the computer-aided design tools 150 using a hardware description language such as Verilog hardware description language (HDL) or Very High Speed Integrated Circuit Hardware Description Language (VHDL). The logic designer can enter the logic design by writing hardware description language code with editor 156. Blocks of code may be imported from libraries if desired.

After the design has been entered using design entry tools 152, behavioral simulation tools 158 may be used to simulate the functional performance of the design. If the functional performance of the design is incomplete or incorrect, the logic designer can make changes to the design using design entry tools 152. The functional operation of the new design can be verified using behavioral simulation tools 158 before synthesis operations have been performed using tools 160. Simulation tools such as tools 158 may also be used at other stages in the design flow if desired (e.g., after logic synthesis). The output of the behavioral simulation tools 158 may be provided to the logic designer in any suitable format (e.g., truth tables, timing diagrams, etc.)

Once the functional operation of the logic design has been determined to be satisfactory, logic synthesis and optimization tools 160 may be used to implement the logic design in a particular programmable logic device (i.e., in the logic and interconnect resources of a particular programmable logic device product or product family). Logic synthesis and optimization tools 160 may be used to implement the logic design in a particular hardened programmable logic device (i.e., in the hardened logic and interconnect resources of a particular hardened programmable logic device product or product family).

Tools 160 can optimize the design by proper selection of the available hardware to implement different logic functions in the logic design. Often tradeoffs are made because multiple logic functions are competing for limited resources.

After logic synthesis and optimization using tools 160, the logic design system may use tools such as placement and routing tools 162 to perform physical design steps (layout synthesis operations). Placement and routing tools 162 are used to determine how to place the circuits for each logic function within the hardened programmable logic device (and programmable logic devices). For example, if two counters interact with each other, the placement and routing tools 162 may locate these counters in adjacent logic regions on the hardened programmable logic device to minimize interconnect delays. The placement and routing tools 162 create orderly and efficient implementations of logic designs for a given hardened programmable logic device.

After an implementation of the desired logic design in the hardened programmable logic device has been generated using placement and routing tools 162, the implementation of the design may be tested using simulation tools such as timing simulation tools 164. Timing simulation tools may, for example, predict the delay times (e.g., predict signal timing characteristics) that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough that the minimum desired clock speed and minimum signal path delay constraints are satisfied. The timing simulation tools may also examine the design for potential race conditions or other conditions that affect device performance.

Timing simulation tools 164 may include one or more timing models such as timing model 166 and timing model 168. As an example, timing model 166 may be based on programmable logic devices and hardened programmable logic devices which have been hardened to maintain signal timing characteristics (e.g., which have been hardened to avoid altering signal timing characteristics from a programmable logic device implementation). Timing model 168 may be based on hardened programmable logic devices which have been hardened in ways that may not maintain signal timing characteristics (e.g., in which circuits that load signal paths have been disabled or disconnected, in which bypass paths are used to shorten signal paths, etc.). If desired, timing simulation tools 164 may include more than two timing models. As another example, timing model 166 may be used for simulating signal timing on programmable logic devices and timing model 168 may be used for simulating signal timing on hardened programmable logic devices such as device 10.

After satisfactory testing using tools 164, the CAD tools 150 can produce optional configuration data 170 for programmable logic device 172 and can generate suitable output data such as the specifications for a custom lithographic mask set for fabricating a hardened integrated circuit incorporating the logic design (e.g., tools 150 may generate mask sets 174).

Optional configuration data 170 may be used to configure programmable devices such as device 172 to test a particular custom circuit design. After the configuration data 170 is used to program programmable device 172, testing and verification operations may be carried out using programmable device 172 to verify proper operation of the custom circuit design embodied by the configuration data 170. Optional feedback information 176 may be used by the user of tools 150 and by tools 150 to modify and improve the implementation of the custom circuit design produced by tools 150 (e.g., by rerunning tools 152, 158, tools 160, tools 162, and/or tools 164 as needed).

Mask set information 174 (e.g., the specifications for one or more lithographic mask sets for fabricating a hardened integrated circuit incorporating the logic design) may be produced by tools 150. The mask set information (e.g., custom fabrication mask specifications associated with a particular custom logic design) may be used by fabrication equipment 178 along with generic mask information (e.g., generic fabrication masks that may be associated with hardened programmable logic devices that may eventually implement a variety of different custom logic designs). Initially, generic masks (i.e., masks for diffusion and contact layers, lower-level metal layers, and lower-level via layers) may be used to form partially completed integrated circuits. These partially completed devices may be maintained in wafer form in storage (e.g., to be completed when orders are received, etc.). As indicated by line 179, partially completed devices (i.e., devices whose dielectric stacks have been fabricated only up to an intermediate layer such as M6 or M7 or other metal layer) may be returned to fabrication equipment 178 when it is desired to form completed devices.

Two types of completed devices may be formed: electrically programmable devices of the type that can be customized by loading configuration data from a configuration integrated circuit and mask-programmed devices of the type that can be customized using mask layers that define desired patterns of custom hardwired links (device 10). Line 181 illustrates how fabrication equipment 178 may be used to finish the manufacturing of the partially finished devices by fabricating the remaining layers of an electrically programmable integrated circuit. Line 183 illustrates how fabrication equipment 178 may be used to finish the manufacturing of the partially finished devices by fabricating the remaining (mask-customized) layers of a hardened programmable integrated circuit. Because the partially finished devices are fabricated using identical masks and identical fabrication steps, it is not necessary to carry excessive inventory at the manufacturing facility and turn-around times may be minimized.

Finished devices may include devices that operate solely as electrically programmable devices (i.e., devices that include programmable elements that are loaded with configuration data but that are free of custom mask-programmed paths). Finished devices may also include devices that operate solely as custom mask-programmed devices (i.e., devices that include custom mask-programmed layers and associated customized signal paths, but that are free of programmable memory elements that can be located with configuration data to control the states of associated pass transistors and other programmable logic). If desired, hybrid devices may be formed by incorporating both electrically programmable elements and hardwired (mask-programmed) paths into the same devices (e.g., electrically programmable logic devices may be implemented using a hybrid approach by incorporating at least some hardwired custom paths using a custom mask or masks and mask-programmed hybrids may be implemented by incorporating at least some electrically programmable circuitry such as memory elements loaded with configuration data into an otherwise mask-programmed device).

Figure 18:
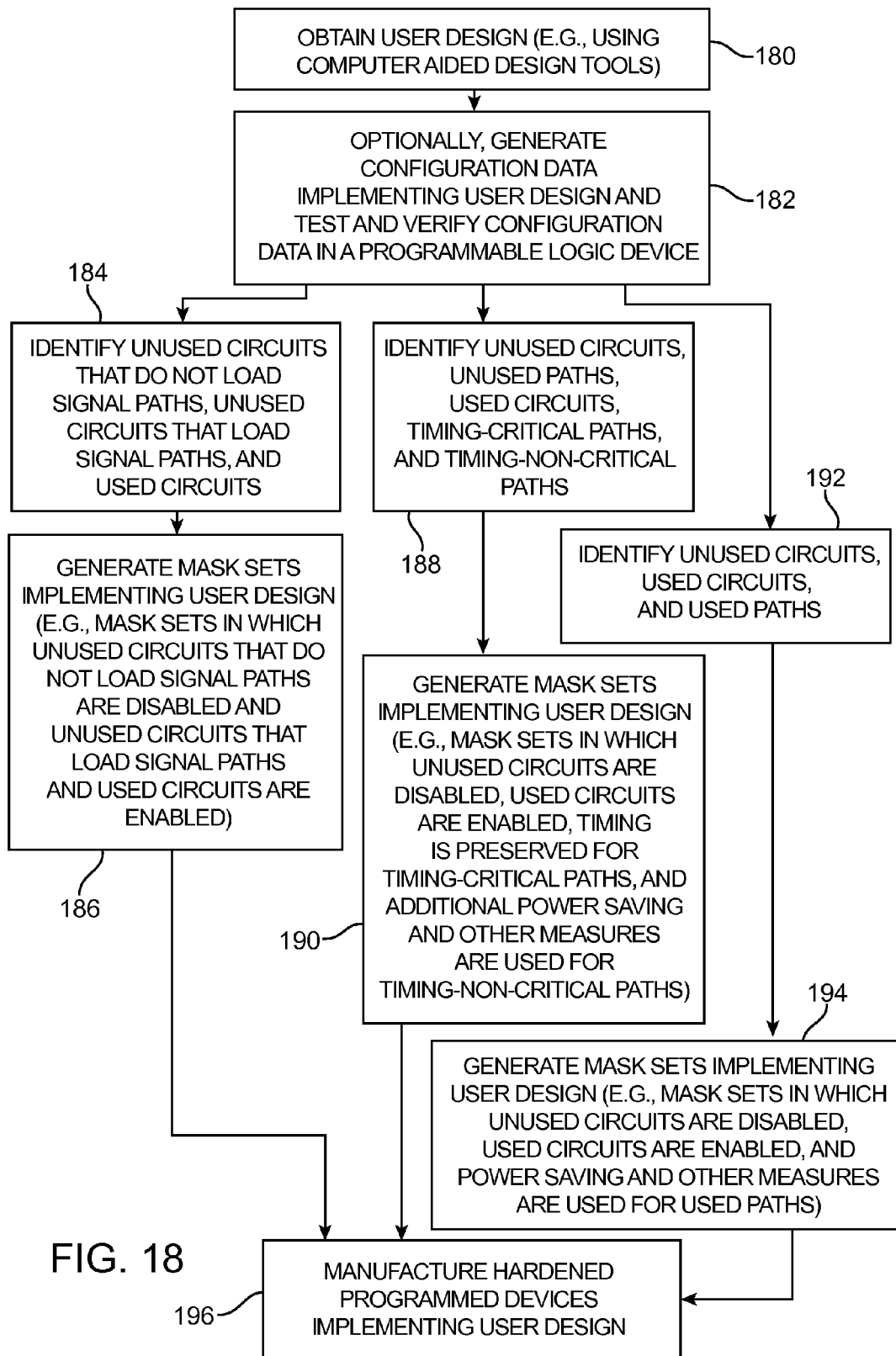
FIG. 18 is a flow chart of illustrative steps involved in manufacturing hardened programmable logic devices such as hardened programmable logic devices of the type shown in FIG. 4 from a user's logic design in accordance with an embodiment of the present invention.

A flow chart of illustrative steps involved in manufacturing hardened programmable logic devices such as device 10 of FIG. 4 is shown in FIG. 18.

In step 180, computer-aided design tools such as tools 150 of FIG. 17 may obtain a custom logic design (i.e., a user design) from a user. The custom logic design may be provided using design entry tools 152 as described in connection with FIG. 17.

In optional step 182, tools such as computer-aided design tools 150 may generate configuration data that, when loaded into configuration memory in a programmable logic device, configures the programmable logic device to implement the custom logic design obtained in step 180. The programmable logic device loaded with the configuration memory may be tested to verify functionality of the custom logic design in a real-world application.

With a first suitable arrangement, step 184 may be performed after step 182. For example, when it is desired to manufacture hardened programmable devices 10 that implement the custom logic design while maintaining signal timing characteristics (e.g., signal path delays) of the custom logic design relative to arrangements in which the custom logic design is implemented in a programmable logic device, tools such as computer-aided design tools 150 may, in step 184, identify unused circuits that do not load signal paths (e.g., unused circuits that do not affect signal timing characteristics), unused circuits that load signal paths (e.g., unused circuits that do affect signal timing characteristics), and circuits that are used in implementing the custom logic design.

After step 184, tools such as computer-aided design tools 150 may generate custom mask sets in step 186 (e.g., mask sets that are customized for the custom logic design). The custom masks sets may be used to manufacture hardened programmable logic devices 10 in step 196 that implement the custom logic design. The custom masks generated in step 186 may ensure that signal timing characteristics of the hardened programmable logic device 10 implementing the custom logic design and manufactured in step 186 will match the signal timing characteristics of programmable logic devices that are programmed with configuration data corresponding to the custom logic design such as the configuration data optionally generated in step 182.

With a second suitable arrangement, step 188 may be performed after step 182. For example, when it is desired to reduce static power while manufacturing hardened programmable devices 10 that implement the custom logic design while maintaining signal timing characteristics of timing-critical paths in the custom logic design relative to arrangements in which the custom logic design is implemented in a programmable logic device, tools such as computer-aided design tools 150 may, in step 188, identify circuits that are not used in the custom logic design (i.e., unused circuits), circuits that are used in the custom logic design (i.e., used circuits), timing-critical paths (e.g., paths for which timing requirements are above a threshold), and timing-non-critical paths (e.g., paths for which timing requirements are below the threshold).

After step 188, tools such as computer-aided design tools 150 may generate custom mask sets in step 190 (e.g., mask sets that are customized for the custom logic design). The custom masks sets may be used to manufacture hardened programmable logic devices 10 in step 196 that implement the custom logic design. The custom masks generated in step 190 may ensure that signal timing characteristics of timing-critical paths of the custom logic design implemented by the hardened programmable logic device 10 will match the signal timing characteristics the timing-critical paths of the custom logic design when implemented using programmable logic devices that are programmed with configuration data corresponding to the custom logic design. As one example, the custom masks generated in step 190 may ensure that circuits that load timing-critical paths remain connected and powered as needed to maintain timing characteristics. Circuits that do not load timing-critical paths, that only load timing-non-critical paths, or that do not load any paths, may be disconnected and/or disabled (i.e., unpowered) as desired to decrease power consumption.

With a third suitable arrangement, step 192 may be performed after step 182. For example, when it is desired to increase the speed and reduce the power consumption of hardened devices 10 that implement the custom logic design, relative to programmable logic devices loaded with configuration data to implement the custom logic design, tools such as computer-aided design tools 150 may, in step 192, identify circuits that are not used in the custom logic design (i.e., unused circuits), circuits that are used in the custom logic design (i.e., used circuits), and used and unused paths.

After step 192, tools such as computer-aided design tools 150 may generate custom mask sets in step 194 (e.g., mask sets that are customized for the custom logic design). The custom masks sets may be used to manufacture hardened programmable logic devices 10 in step 196 that implement the custom logic design. The custom masks generated in step 194 may disable unused circuits, enable used circuits, and implement power saving and bypass measures for used paths and unused paths. Because the signal timing characteristics of hardened programmable logic devices 10 that implement the custom logic design may be different from the signal timing characteristics of programmable logic devices loaded with configuration data to implement the custom logic design, tools 150 may simulate the timing characteristics of device 10 using timing simulation tools 164 and a timing model such as model 166.

During the manufacturing operations of step 196, both custom and standard (generic) masks may be used. The generic masks may be used in forming lower levels on an integrated circuit (e.g., a first set of metal and via layers). These lower levels may be used by both a product family of unhardened devices that are electrically programmed by loading configuration data into programmable memory elements and a product family of hardened devices. Upper levels may then be formed using different masks, depending on whether it is desired to fabricate electrically programmable logic devices or mask-customized programmable logic devices. The lower levels of both types of devices will contain identical layers (e.g., identically patterned metal and via layers, identically patterned contact and diffusion patterns, etc.).

When a manufacturer receives an order for hardened devices that implement a given custom logic design, the masks for the lower levels may be used in forming the lower levels of the hardened devices or the manufacturer may retrieve devices from storage that have been partially fabricated (e.g., devices that have been manufactured using the masks for the lower levels, but that have not yet been further processed using masks for the remaining upper levels). Once devices with the lower levels have been obtained (by fabricating these devices using the lower-level masks that are common to both hardened and unhardened product families or by obtaining such devices from storage), manufacturing operations may be performed to customize the upper levels of the device using custom masks for the given custom logic design (e.g., using masks of the type generated in steps 186, 190, and 194).

If desired, some combination of steps 184, 188, 192 and associated steps 186, 190, and 194 may be performed. The steps shown in FIG. 18 are merely illustrative examples.

Figure 19:
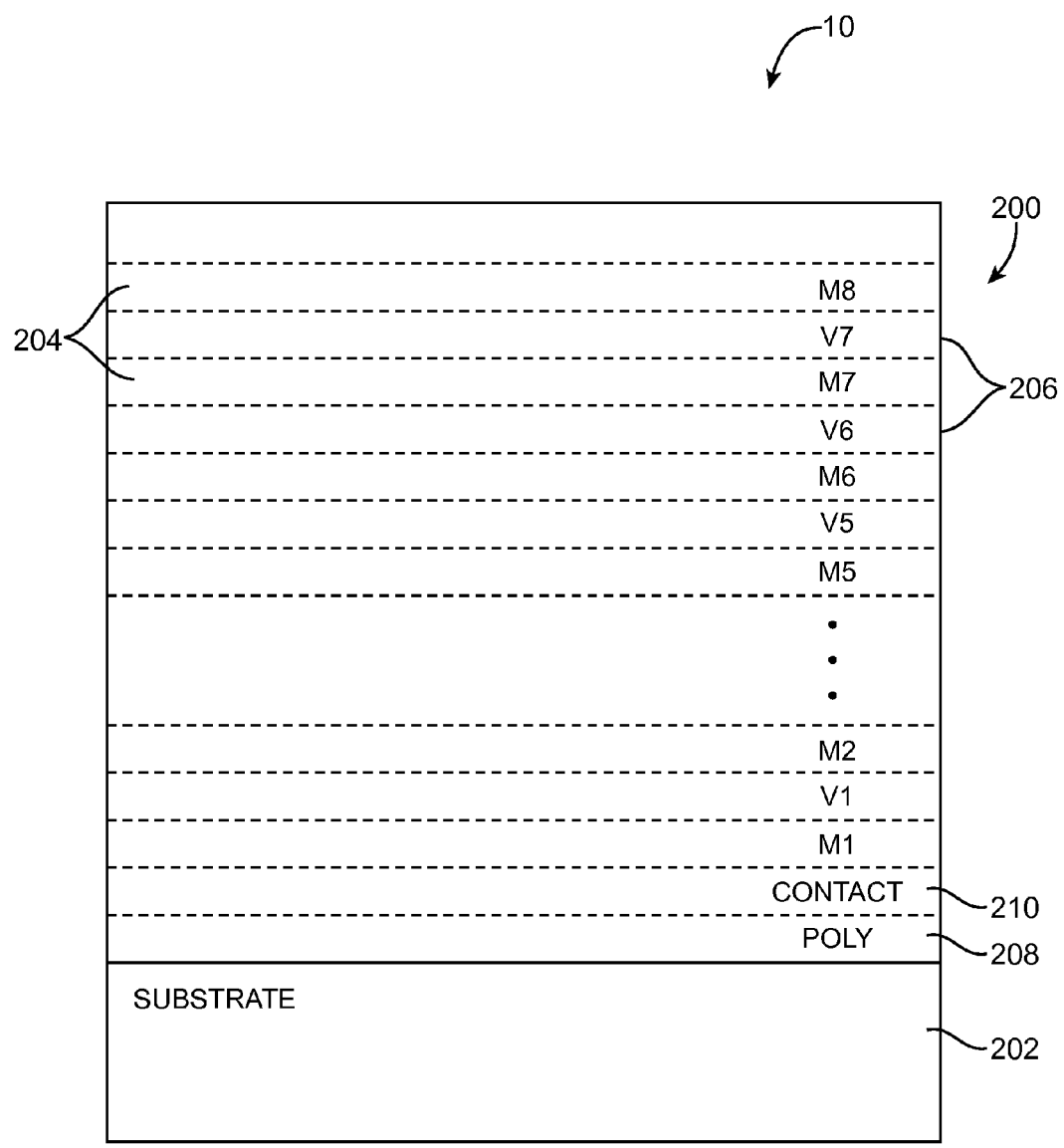
FIG. 19 is a cross-sectional side view of an illustrative hardened programmable logic device in accordance with an embodiment of the present invention.

As shown in the cross-sectional side view of FIG. 19, hardened programmable device 10 and programmable logic devices may be formed from a dielectric stack such as stack 200. Dielectric stack 200 contains interconnect routing structures that route signals on the integrated circuit (e.g., on device 10).

Dielectric stack 200 may be formed on top of integrated circuit substrate 202. Substrate 202 may be formed from crystalline silicon, as an example. Transistors, diodes, and other active devices may be formed from substrate 202. Signals are routed between these devices using the routing capabilities of the dielectric stack 200.

The dielectric stack 200 includes an upper interconnect layer 204 and a number of lower interconnect layers 204. In FIG. 19, the upper interconnect layer is labeled "M8", because the fabrication process used to form the circuit of FIG. 19 may use eight metal interconnect layers 204. This is merely an example and, in general, device 10 may include any number of metal interconnect layers. The lower metal interconnect layers 204 are labeled M7, M6, . . . , M1. Above the upper interconnect layer, labeled "M8", additional layers such as bond pad metal layers may be formed if desired.

During fabrication, the metal interconnect layers may be patterned to form conductive routing paths, which are sometimes called interconnects. These paths are typically used to interconnect devices on the integrated circuit so that they perform desired circuit functions. Via interconnect layers 206 are used to form short vertical conductors called vias that are used to connect interconnects in adjacent layers. The via interconnect layers 206 in FIG. 19 are labeled V7, V6, . . . , V1. A via in via interconnect layer V7 can be used to connect an interconnect in the M8 layer to an interconnect in the M7 layer. Similarly, a via in the V1 via layer may be used to interconnect an M2 interconnect to an M1 interconnect.

In both the metal interconnect layers 204 and the via interconnect layers 206, some of the layer makes up conductive pathways and some of the layer is insulating dielectric (i.e., silicon oxide). In the metal interconnect layers 204, dielectric surrounds interconnects. In the via interconnect layers 206, dielectric surrounds vias.

Device 10 may include a polysilicon layer 208 adjacent to the silicon substrate 202. Layer 208 may be patterned to form transistor gates and other device structures. Contact layer 210 may be a via-type layer in which short vertical conductors are formed (e.g., using tungsten plugs or using plugs form from another material). The plugs in contact layer 210 are used to electrically connect patterned polysilicon in layer 208 to patterned metal in the M1 metal interconnect layer.

As described herein, hardened programmable logic devices may be manufactured using generic fabrication masks and using custom fabrication mask. The fabrication masks may be used in lithographic manufacturing steps to pattern and form structures in substrate 202, polysilicon layer 208, contact layer 210, metal interconnect layers 204, and via interconnect layers 206. Typically, each fabrication mask is used to pattern a single layer. As many layers in dielectric stack 200 as practical may be formed from generic fabrication masks, thereby reducing the number of custom fabrication masks needed for each custom logic design.

Generic fabrication masks may be formed to use in the manufacture of a product family of hardened programmable devices 10. While each of the hardened programmable devices 10 may implement only a single custom logic design once manufactured, hardened programmable devices 10 that implement different custom logic designs may nonetheless be manufactured using at least some generic fabrication masks that are common to hardened programmable devices in a product family (e.g., regardless of which specific custom logic design the devices will eventually implement). Because the generic fabrication masks can be reused for the manufacture of hardened programmable devices 10 that implement different custom logic designs, the cost to manufacture hardened programmable devices may be reduced. Fabrication masks that are used in the manufacture of hardened programmable devices that will eventually implement at least two different custom logic designs may be referred to herein as generic fabrication masks.

In addition to (or in place of) the generic fabrication masks, custom fabrication masks may be formed to use in the manufacture of hardened programmable devices 10 that implement a particular custom logic design. Fabrication masks that are used in the manufacture of hardened programmable devices that will eventually implement only a single custom logic design may be referred to herein as custom fabrication masks.

With one suitable arrangement, some or all of the generic fabrication masks used in the production of a product family of hardened programmable devices 10 may also be used in the production of a product family of programmable logic devices. With this type of arrangement, additional generic fabrication masks may be used to complete production of programmable logic devices in that programmable product family while additional custom (and potentially additional generic) fabrication masks may be used to complete production of hardened programmable logic devices such as device 10 in that hardened programmable product family.

The generic and custom fabrication masks may be designed such that generic fabrication masks are used on lower layers of dielectric stack 200 in hardened programmable devices such as device 10 (and in programmable logic devices) while custom fabrication masks are used on upper layers of dielectric stack 200 in hardened programmable devices. Because fabrication masks for upper layers of dielectric stack 200 tend to have larger lithographic structures, the cost of producing fabrication masks for upper layers of stack 200 may be less than the cost of producing fabrication masks for lower layers of stack 200. By manufacturing devices 10 whose custom layers are higher, the cost of manufacturing may be reduced. Additionally, it may take a significant amount of time to manufacture an individual dielectric stack for a hardened programmable logic device such as device 10 or for a programmable logic device. By manufacturing devices 10 whose generic layers are lower, manufacturing of a product family of hardened programmable logic devices can begin before the custom layers that differentiate the devices into devices that implement a single custom logic design are fabricated (e.g., because the custom masks are not needed until after the generic layers, since stack 200 is typically manufactured from the bottom up). In addition, in arrangements in which some or all of the generic fabrication masks used in production of hardened devices such as device 10 as also used in the production of a product family of programmable logic devices, the initial manufacturing of the hardened devices and the programmable logic devices may be identical, such that manufacturing can begin before it is decided if hardened devices will be manufactured or programmable logic devices will be manufactured. These types of arrangements may allow for quick turnaround time in manufacturing hardened devices such as device 10 and programmable logic devices, since common "starter" dielectric stacks may be manufactured before a final determination about exactly what is being manufactured is made.

Figure 20:
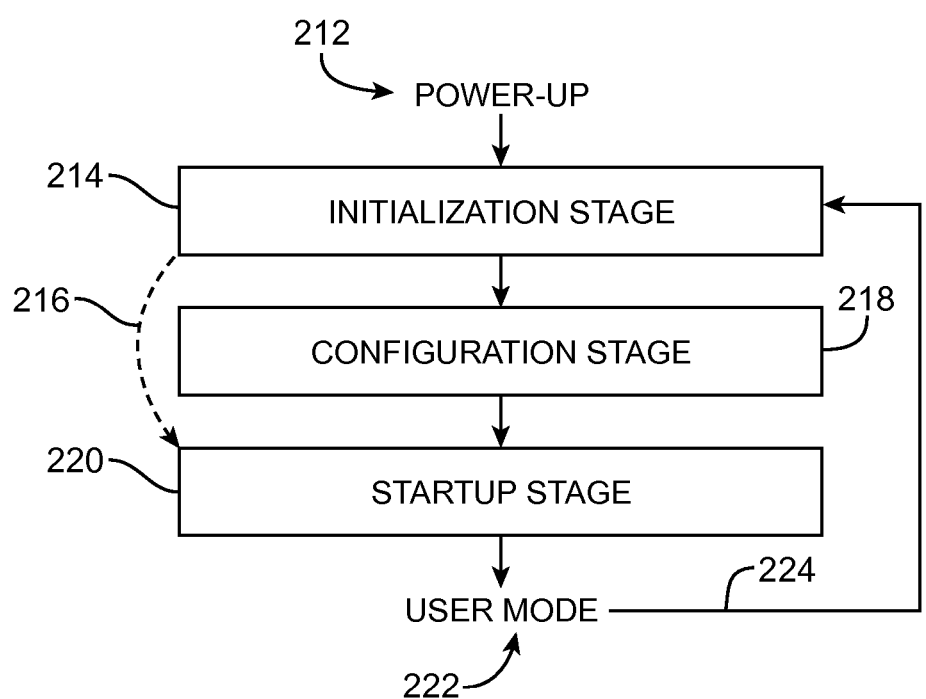
FIG. 20 is a diagram of illustrative operating stages of hardened programmable logic devices such as hardened programmable logic devices of the type shown in FIG. 4 in accordance with an embodiment of the present invention.

As shown in FIG. 20, hardened programmable logic devices such as device 10 may operate in various operating modes.

When devices such as hardened programmable logic device 10 and programmable logic devices power-up (as indicated by step 212), the devices may enter an initialization stage 214. In initialization stage 214, initialization circuitry (e.g., an initialization state machine) may apply signals to circuits (e.g., logic, registers, memory elements, transistors, etc.) in the devices to ensure that the circuits are static and not creating contentions (e.g., excessive current draws).

After some period of initialization time, programmable logic devices and hardened programmable logic devices that still include at least some configuration memory elements 20 that are not hardened (i.e., hardwired) may enter a configuration stage 218. In configuration stage 218, internal programming circuitry (e.g., a configuration state machine) receives configuration data from external configuration memory (such as memory 1022 of FIG. 2) and loads the configuration data into configuration memory elements. If devices are hardened programmable logic devices that include only hardwired configuration memory elements (e.g., none of the configuration memory elements of the devices need to be loaded with configuration), configuration stage 218 may be bypassed as illustrated by dashed line 216.

After the configuration data is loaded into configuration memory elements or after initialization stage 214 when configuration mode 218 is bypassed, the devices may enter a startup mode 220. In startup mode 220, the signals applied in initialization stage 214 to ensure the circuits are static and not creating contention may be released so that the circuits of the devices can begin operation.

After startup mode 220, the devices may enter a user mode 222 in which the devices implement a particular custom logic device.

As illustrated by line 224, a device may be reset or reconfigured if desired. As one example, the device may be a hardened programmable logic device with non-hardened configuration memory elements that may be reconfigured to reload configuration data from external memory when a corruption of loaded configuration data is detected.

The foregoing is merely illustrative of the principles of this invention and various modifications can be made by those skilled in the art without departing from the scope and spirit of the invention. The foregoing embodiments may be implemented individually or in any combination.

What is claimed is:

1. Circuitry that implements a given custom logic design, comprising:
   at least one multiplexer with an output, a plurality of inputs, and a plurality of transistors that have gate terminals, wherein a selected input of the plurality of inputs is directly connected to the output via a signal path, wherein the gate terminal of at least one of the transistors is hardwired to a ground power supply line, and wherein the plurality of transistors comprises:
      a first transistor having a first source-drain terminal that is directly connected to the signal path and having a second source-drain terminal that is not directly connected to the signal path; and
      a second transistor having a first source-drain terminal that is directly connected to the signal path and having a second source-drain terminal that is not directly connected to the signal path.

2. The circuitry defined in claim 1 wherein the multiplexer does not have a closed conductive circuit between the first source-drain terminal of the second transistor and the second source-drain terminal of the first transistor.

3. The circuitry defined in claim 2 wherein the multiplexer has a closed conductive circuit between the first source-drain terminal of the first transistor and the signal path.

4. The circuitry defined in claim 2 wherein the multiplexer does not have a closed conductive circuit between the first source-drain terminal of the first transistor and the signal path.

5. The circuitry defined in claim 1 further comprising:
   a conductive path that connects the selected input to the output without passing through any of the transistors.

6. Circuitry that implements a given custom logic design, comprising:
   at least one multiplexer with an output, a plurality of inputs, and transistors, wherein a selected input of the plurality of inputs is hardwired to the output, wherein the multiplexer includes at least three inputs, wherein the gate terminals of at least two of the transistors are hardwired to a positive power supply line such that the selected input is hardwired to the output through the at least two transistors, and wherein the gate terminals of at least an additional two of the transistors are hardwired to a ground power supply line.

7. The circuitry defined in claim 6 wherein each of the transistors comprises an n-channel transistor.

8. The circuitry defined in claim 6 further comprising:
   at least one hardwired bypass path that bypasses at least one of the transistors of the multiplexer.

9. The circuitry defined in claim 6 further comprising:
   a plurality of hardwired bypass paths, each of which bypasses a respective one of the transistors of the multiplexer.

10. The circuitry defined in claim 6 further comprising:
    at least one hardwired bypass path that hardwires the selected input to the output of the multiplexer.

* * * * *